United States Patent
Hong et al.

(10) Patent No.: US 11,487,474 B2
(45) Date of Patent: Nov. 1, 2022

(54) MEMORY SYSTEM AND METHOD OF OPERATING A MEMORY DEVICE INCLUDED IN THE SAME

(71) Applicant: SK hynix Inc., Icheon-si (KR)

(72) Inventors: Yong Hwan Hong, Icheon-si (KR); Byung Ryul Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/177,036

(22) Filed: Feb. 16, 2021

(65) Prior Publication Data
US 2022/0050632 A1 Feb. 17, 2022

(30) Foreign Application Priority Data
Aug. 14, 2020 (KR) .................. 10-2020-0102748

(51) Int. Cl.
*G06F 3/06* (2006.01)
*G06F 13/10* (2006.01)

(52) U.S. Cl.
CPC .......... *G06F 3/0659* (2013.01); *G06F 3/0604* (2013.01); *G06F 3/0673* (2013.01); *G06F 13/102* (2013.01)

(58) Field of Classification Search
None
See application file for complete search history.

(56) References Cited

U.S. PATENT DOCUMENTS

| 8,572,311 B1* | 10/2013 | Shalvi | G06F 11/14 711/103 |
| 2011/0055458 A1* | 3/2011 | Kuehne | G06F 12/0246 711/E12.001 |
| 2015/0092494 A1* | 4/2015 | Rhie | G11C 16/16 365/185.11 |
| 2019/0332316 A1* | 10/2019 | Kanno | G06F 12/0246 |
| 2020/0183600 A1* | 6/2020 | Woo | G06F 3/0611 |
| 2020/0371908 A1* | 11/2020 | Cariello | G06F 12/0246 |

FOREIGN PATENT DOCUMENTS

| KR | 1020180046405 A | 5/2018 |
| KR | 1020200018999 A | 2/2020 |

* cited by examiner

*Primary Examiner* — Elias Mamo
(74) *Attorney, Agent, or Firm* — William Park & Associates Ltd.

(57) ABSTRACT

A memory system includes: a plurality of memory devices including a memory cell array having a plurality of planes, the plurality of memory devices being commonly connected to a memory controller through a channel; a super block including pages included in the planes of at least two memory devices among the plurality of memory devices; and the memory controller for transmitting, to the memory devices, at least one command instructing an operation on the super block and an address corresponding to the command. Each of the memory devices includes: peripheral circuit for performing the operation on the memory cell array; a group selection signal generator for outputting a group selection signal indicating the at least two memory devices constituting the super block; and control logic for controlling the peripheral circuit to perform an operation corresponding to the command, based on the group selection signal.

18 Claims, 17 Drawing Sheets

MEMORY SYSTEM AND METHOD OF OPERATING A MEMORY DEVICE INCLUDED IN THE SAME

CROSS-REFERENCE TO RELATED APPLICATION

The present application claims priority under 35 U.S.C. § 119(a) to Korean patent application number 10-2020-0102748, filed on Aug. 14, 2020, in the Korean Intellectual Property Office, the entire disclosure of which is incorporated herein by reference.

BACKGROUND

1. Technical Field

The present disclosure generally relates to a memory system, and more particularly, to a memory system and a method of operating a memory device included in the memory system.

2. Related Art

A storage device is a device which stores data under the control of a host device such as a computer or a smart phone. The storage device may include a memory device which stores data and a memory controller which controls the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EPROM), a flash memory, and the like.

SUMMARY

In accordance with an aspect of the present disclosure, there is provided a memory system. The memory system may include: a plurality of memory devices including a memory cell array having a plurality of planes, the plurality of memory devices being commonly connected to a memory controller through a channel; a super block including pages included in the planes of at least two memory devices among the plurality of memory devices; and the memory controller configured to transmit, to the memory devices, at least one command instructing an operation on the super block and an address corresponding to the command.

Each of the memory devices may include: a peripheral circuit configured to perform the operation on the memory cell array; a group selection signal generator configured to output a group selection signal indicating the at least two memory devices constituting the super block; and control logic configured to control the peripheral circuit to perform an operation corresponding to the command, based on the group selection signal.

In accordance with another aspect of the present disclosure, there may be provided a method of operating a memory device, the method may include: receiving a group address allocation command and a first group address from a memory controller; storing the first group address in a group address register as a response to the group address allocation command; receiving a group selection command and a second group address from the memory controller; generating a group selection signal, based on a result obtained by comparing the first group address and the second group address, as a response to the group selection command; receiving at least one command instructing an operation on a super block and an address corresponding to the command from the memory controller; and performing an operation corresponding to the command, based on the group selection signal.

The memory device may include a plurality of planes and be connected to a memory controller through a channel.

The super block may include pages included in planes of at least two memory devices among a plurality of memory devices commonly connected to the memory controller through the channel.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory system capable of rapidly performing a program operation or a read operation on a super block configured by using at least two memory devices, and a method of operating a memory device included in the memory system.

Figure 1:
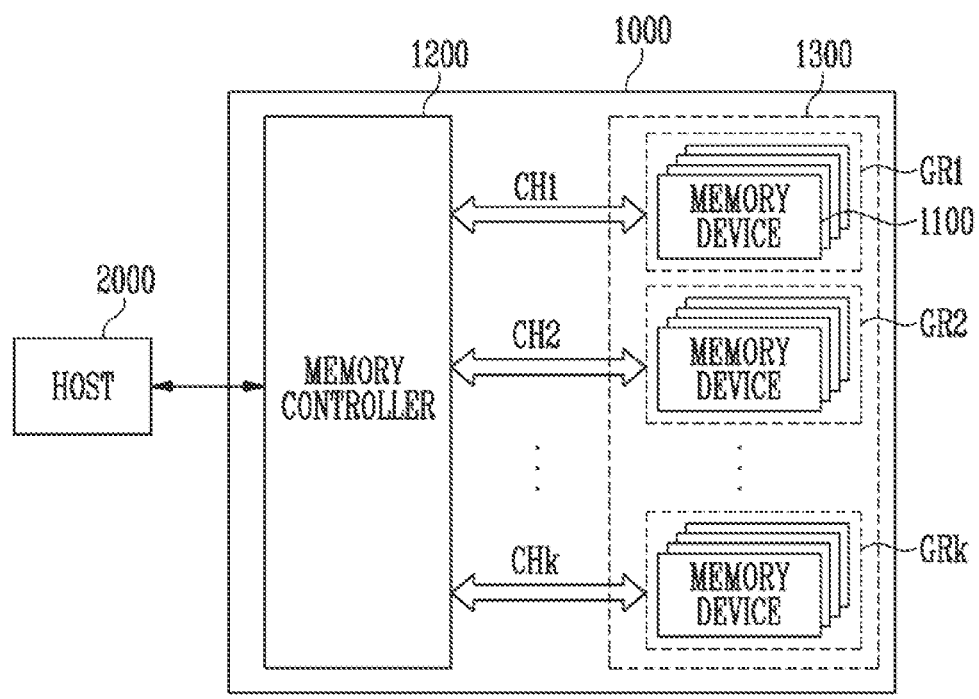
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a memory device 1100 in which data is stored and/or a memory controller 1200 which controls the memory device 1100 according to a request of a host 2000.

The host 2000 may communicate with the memory system 1000 by using at least one of various communication schemes, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The memory device 1100 may be implemented as a volatile memory device in which data disappears when the supply of power is interrupted or a nonvolatile memory device in which data is retained even when the supply of power is interrupted. The memory device 1100 may perform a program operation, a read operation, or an erase operation under the control of the memory controller 1200. For example, in the program operation, the memory device 1100 may receive a command, an address, and data, which are input from the memory controller 1200, and perform the program operation. In the read operation, the memory device 1100 may receive a command and an address, which are input from the memory controller 1200, and output, to the memory controller 1200, data stored at a position (e.g., a physical address) corresponding to the input address. The memory device 1100 is an individual Integrated Chip (IC) on which device processing is completely performed, and may be designated as a chip or a die.

The memory system 1000 may include a plurality of memory devices 1100, and the plurality of memory devices may be grouped into a plurality of memory device groups 1300 according to a channel connected to the memory controller 1200. For example, memory devices connected to the memory controller 1200 through a first channel CH1 among the memory devices may be designated as a first group GR1, and memory devices connected to the memory controller 1200 through a second channel CH2 among the memory devices may be designated as a second group GR2. Although a case where one group includes a plurality of memory devices has been illustrated in FIG. 1, one group may include a single memory device 1100.

The memory controller 1200 may control overall operations of the memory system 1000, and control data exchange between the host 2000 and the memory device 1100. For example, when a command is received from the host 2000, the memory controller 1200 may control memory device groups 1300 connected to each of channels CH1 to CHk according to the received command. The memory controller 1200 may program, read or erase data by controlling the memory device groups 1300 connected to each channel according to a request of the host 2000.

Figure 2:
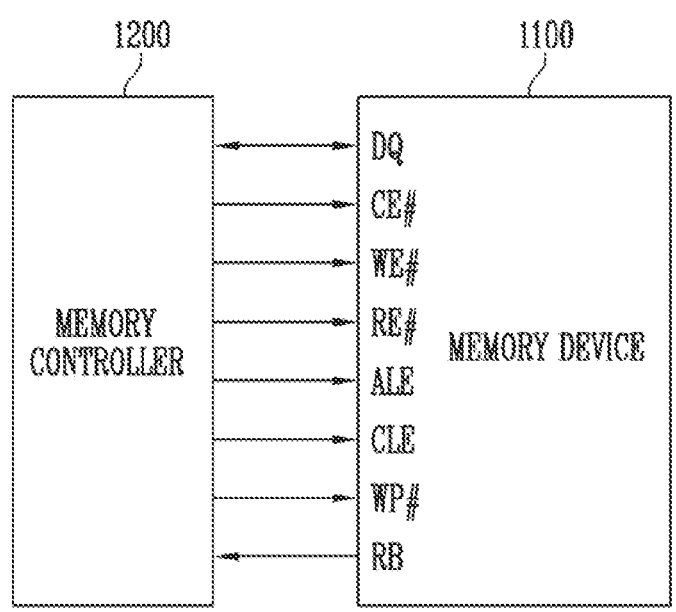
FIG. 2 is a diagram illustrating signals exchanged between a memory controller and a memory device, which are shown in FIG. 1.

FIG. 2 is a diagram illustrating signals exchanged between the memory controller and the memory device, which are shown in FIG. 1.

Referring to FIG. 2, the memory controller 1200 and the memory device 1100 may exchange a command, data, and/or an address through an input/output pad DQ. For example, the input/output pad DQ may be configured with 8 lines, to transmit/receive 8-bit data, and each line may transmit/receive 1-bit data.

The memory device 1100 may receive a chip enable signal through a CE# pad, receive a write enable signal through a WE# pad, receive a read enable signal through a RE# pad, receive an address latch enable signal through an ALE pad, receive a command latch enable signal through a CLE pad, and receive a write protection signal through a WP# pad.

The address latch enable signal may be a signal with which the memory controller 1200 instructs the memory device 1100 to load an address provided to the memory device 1100 through the input/output pad DQ to an address register. The chip enable signal may be a signal with which the memory controller 1200 instructs the memory device 1100 to enable or disable one or more memory devices. The command latch enable signal may be a signal with which the memory controller 1200 instructs the memory device 1100 to load a command provided to the memory device 1100 through the input/output pad DQ to a command register. The read enable signal may be a signal with which the memory controller 1200 instructs the memory device 1100 to transmit data to the memory controller 1200. The write enable signal may be a signal for informing that a command, an address, and data are transferred.

The memory device 1100 may output a ready-busy signal to the memory controller 1200 through an RB pad. The ready-busy signal may indicate whether a memory array of the memory device 1100 is in a busy state or an idle state.

Although a connection relationship between one memory device 110 and the memory controller 1200 has been illustrated in FIG. 2, the input/output pad DQ, the CE# pad, the WE# pad, the RE# pad, the ALE pad, the CLE pad, and the WP# pad may form one of the channels CH1 to CHk, and one of the memory device groups 1300 may be connected to the memory controller 120 through the formed channel.

Therefore, when the memory controller 1200 transmits a command, data, and/or an address through an input/output pad DP included in one channel, all memory devices 1100 belonging to a group connected to the corresponding channel or a memory device 1100 selected by the memory controller 1200 in the group connected to the corresponding channel may receive the command, the data, and/or the address. For example, the memory controller 1200 may transmit a status read command to memory devices 1100 through an input/output pad DQ corresponding to the first channel CH1, and at least one of the memory devices in the first group GR1 connected to the first channel GR1 may transmit status information to the input/output pad DQ as a response to the status read command.

Figure 3:
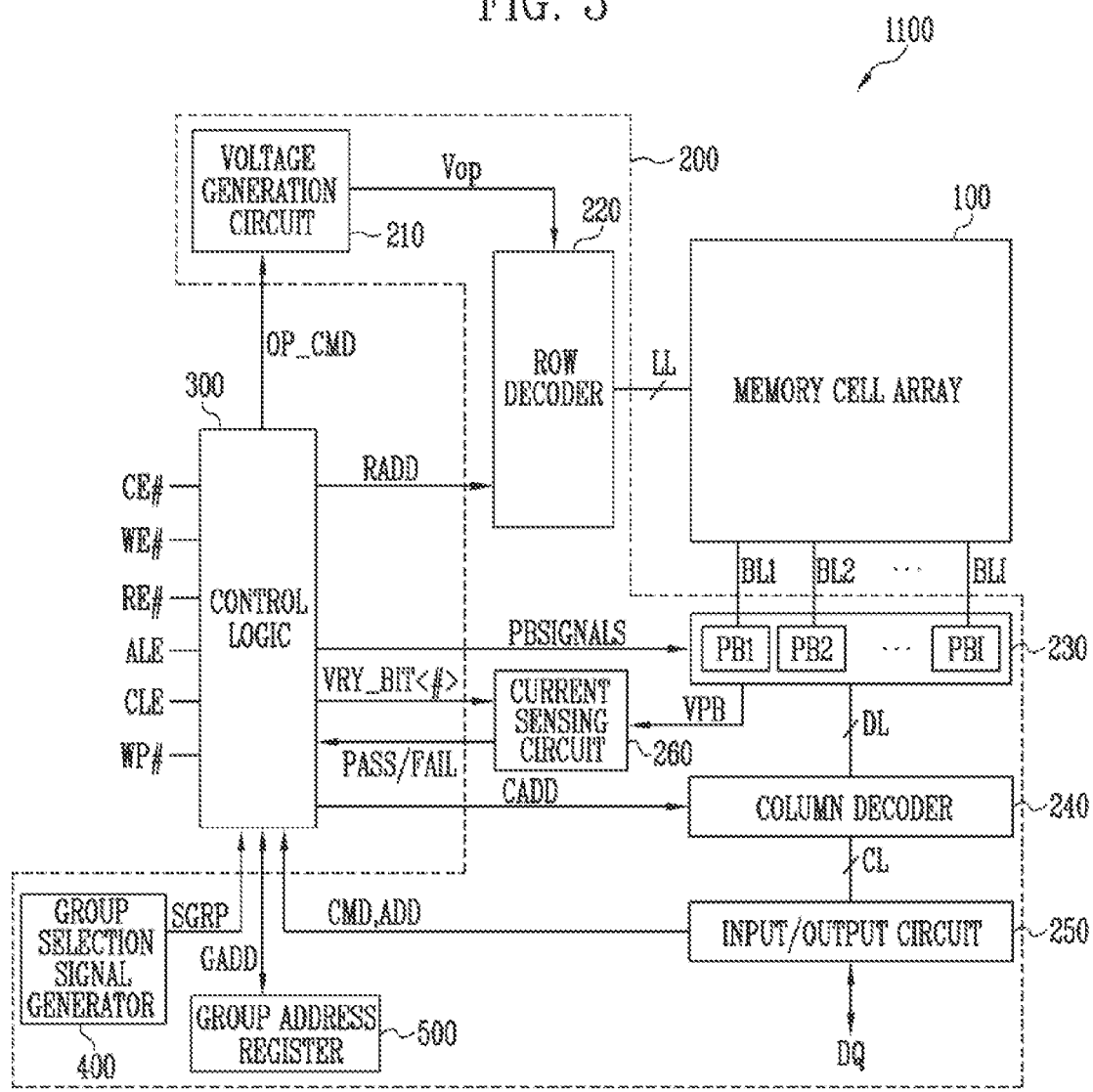
FIG. 3 is a diagram illustrating the memory device shown in FIG. 1.

FIG. 3 is a diagram illustrating the memory device shown in FIG. 1.

The memory device 1100 may be implemented as a volatile memory device or a nonvolatile memory device. For example, the memory device 1100 may be one of a volatile memory device such as a Dynamic Random Access Memory (DRAM) or a Static RAM (SRAM) and a nonvolatile memory device such as a Read Only Memory (ROM), a Mask ROM (MROM), a Programmable ROM (PROM), an Erasable ROM (FROM), an Electrically Erasable ROM (EEROM), a Ferromagnetic ROM (FROM), a Phase change RAM (PRAM), a Resistive RAM (RRAM), or a flash memory. In FIG. 3, a nonvolatile memory device will be illustrated as an example.

The memory device 1100 may include a memory cell array 100 in which data is stored. The memory device 1100 may include a peripheral circuit 200 configured to perform a program operation for storing data in the memory cell array 100, a read operation for outputting stored data, and an erase operation for erasing stored data. The memory device 1100 may include control logic 300 which controls the peripheral circuit 200 under the control of the memory controller 1200. The control logic 300 may be implemented as hardware, software, or a combination of hardware and software. For example, the control logic 300 may be a control logic circuit operating in accordance with an algorithm and/or a processor executing control logic code.

The memory cell array 100 includes a plurality of memory cells in which data is stored. For example, the memory cell array 100 may include at least one plane, and the plane may include one or more memory blocks. In an embodiment, the plane may be a unit of a memory area accessed when a program, read or erase operation is performed. Each of the memory blocks may include a plurality of memory cells. A structure in which a plurality of planes are included may be designated as a multi-plane structure. User data and information necessary for an operation of the memory device 1100 may be stored in the memory blocks. The memory blocks may be implemented in a two-dimensional or three-dimensional structure. The memory blocks having the two-dimensional structure may include memory cells arrange in parallel to a substrate, and the memory blocks having the three-dimensional structure may include memory cells stacked vertically to a substrate.

The peripheral circuit 200 may be configured to perform program, read, and erase operations under the control of the control logic 300. For example, the peripheral circuit 200 may include a voltage generation circuit 210, a row decoder 220, a page buffer group 230, a column decoder 240, an input/output circuit 250, and a current sensing circuit 260.

The voltage generation circuit 210 may generate various operating voltages Vop used for program, read, and erase operations in response to an operation signal OP_CMD output from the control logic 300. For example, the voltage generation circuit 210 may generate various voltages such as a program voltage, a verify voltage, a pass voltage, a read voltage, and an erase voltage under the control of the control logic 300.

The row decoder 220 may supply the operating voltages Vop to local lines LL connected to a selected memory block among the memory blocks of the memory cell array 100 in response to a row address RADD output from the control logic 300. The local lines LL may include local word lines, local drain select lines, and/or local source select lines. In addition, the local lines LL may include various lines connected to the memory block, such as a source line.

The page buffer group 230 may be connected to bit lines BL1 to BLI connected to the memory blocks of the memory cell array 100. The page buffer group 230 may include a plurality of page buffers PB1 to PBI connected to the bit lines BL1 to BLI. The page buffers PB1 to PBI may operate in response to page buffer control signals PBSIGNALS output from the control logic 300. For example, the page buffers PB1 to PBI may temporarily store data receive through the bit lines BL1 to BLI, or sense voltages or currents of the bit lines BL1 to BLI in a read or verify operation.

The column decoder 240 may transfer data between the input/output circuit 250 and the page buffer group 230 in response to a column address CADD output from the control logic 300. For example, the column decoder 240 may exchange data with the page buffers PB1 to PBI through data lines DL, or exchange data with the input/output circuit 250 through the column lines CL.

The input/output circuit 250 may receive a command CMD, an address ADD, and data from the controller 1200 through an input/output pad DQ, and output data read from the memory cell array 100 to the memory controller 1200 through the input/output pad DQ. For example, the input/output circuit 250 may transfer the command CMD and the address ADD, which are received from the memory controller 1200, to the control logic 300, or exchange data DATA with the column decoder 240.

In a read operation or a verify operation, the current sensing circuit 260 may generate a reference current in response an allow bit VRY_BIT<#>, and output a pass signal PASS or a fail signal FAIL by comparing a reference voltage generated by the reference current with a sensing voltage VPB received from the page buffer group 230.

The control logic 300 may receive a command CMD and an address ADD in response to signals received through CE#, WE#, RE#, ALE, CLE, and WP# pads. The control logic 300 may generate control signals for the peripheral circuit 200 and output the generated control signals to the peripheral circuit 200 as a respond to that the control logic 300 has received the command CMD and the address ADD. For example, the control signals may include at least one of the operation signal OP_CMD, the row address RADD, the page buffer control signals PBSIGNALS, and the allow bit VRY_BIT<#>. The control logic 300 may output the operation signal OP_CMD to the voltage generation circuit 210, output the row address RADD to the row decoder 220, output the page buffer control signals PBSIGNALS to the page buffer group 230, and output the allow bit VRY_BIT<#> to the current sensing circuit 260. Also, the control logic 300 may determine whether a verify operation has passed or failed in response to the pass signal PASS or the fail signal FAIL.

The memory device 1100 may include a group selection signal generator 400 which generates a group selection signal SGRP and outputs the group selection signal SGRP to the control logic 300 and a group address register 500 which stores a group address GADD.

The group address GADD may be an address commonly allocated to at least two memory devices constituting a super block SBLK configured with pages included in planes P1 to P4 included in the at least two memory devices to perform an operation (e.g., a program operation or a read operation) on the super block SBLK.

Meanwhile, the control logic 300 may receive, through the input/output circuit 250, a group address allocation command D5h to AAh and a group selection command AAh as commands which the memory controller 1200 transmits to at least two memory devices constituting a super block SBLK.

The control logic 300 may store a group address GADD received from the memory controller 1200 through the input/output circuit 250 in the group address register 500, corresponding to the group address allocation command, generate a signal corresponding to a stored operation, and provide the generated signal to the group selection signal generator 400.

The control logic 300 may compare a group address received together with the group selection command with the group address GADD stored in the group address register 500, generate a signal indicating a comparison result, and provide the generated signal to the group selection signal generator 400.

The group selection signal generator 400 may generate a group selection signal SGRP as a signal indicating at least two memory devices constituting a super block SBLK. For example, the group selection signal generator 400 may generate the group selection signal SGRP, based on the group address allocation command received from the memory controller 1200 and signals generated by the control logic 300 according to the group selection command (however, the signals may be generated by another independent signal generating circuit except the control logic 300).

When the group selection signal SGRP is output from the group selection signal generator 400, the control logic 300 may respond to a command received from the memory controller 1200, based on the group selection signal SGRP, or control a reset operation on the page buffer group 230 by controlling the peripheral circuit 200.

Figure 4:
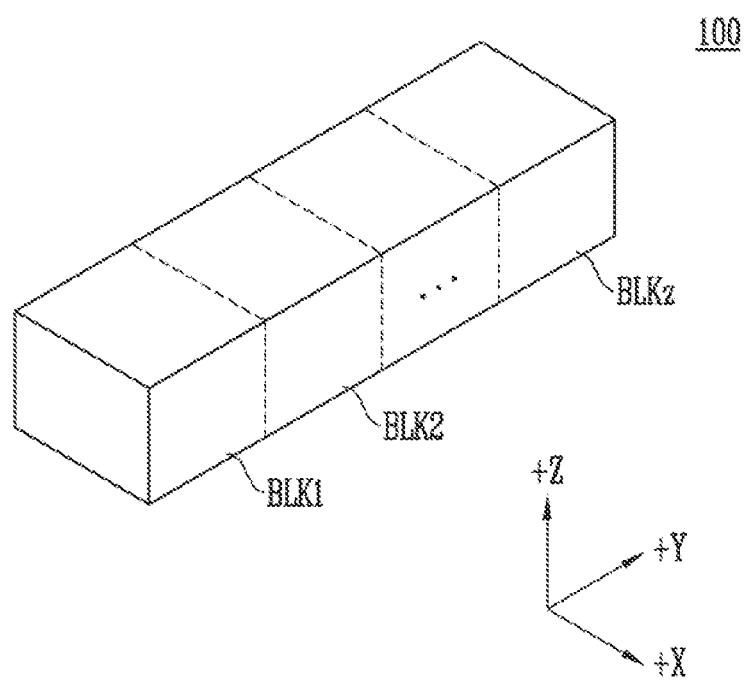
FIG. 4 is a diagram illustrating an embodiment of a memory cell array shown in FIG. 3.

FIG. 4 is a diagram illustrating an embodiment of the memory cell array shown in FIG. 3.

Referring to FIG. 4, the memory cell array 100 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions.

Figure 5:
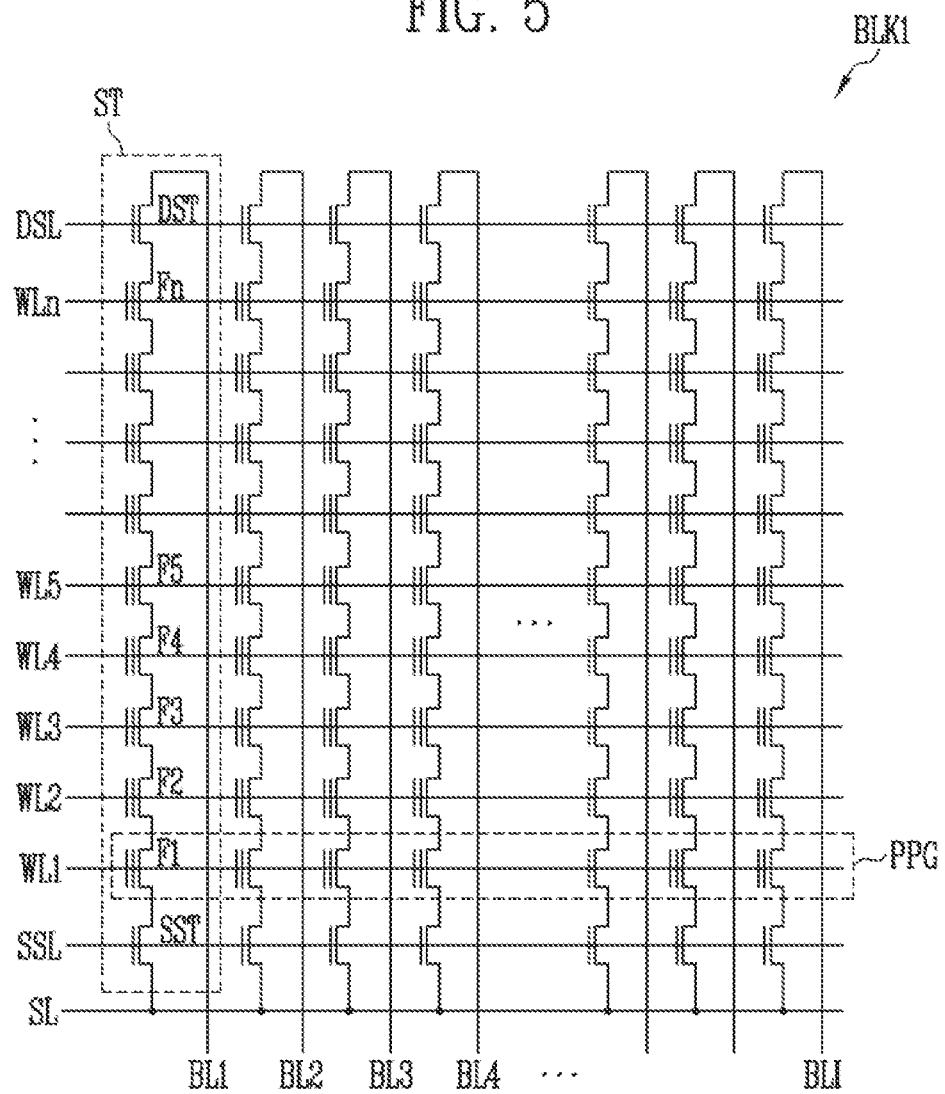
FIG. 5 is a diagram illustrating a memory block shown in FIG. 4.

FIG. 5 is a diagram illustrating the memory block shown in FIG. 4.

Referring to FIG. 5, a first memory block BLK1 among the plurality of memory blocks BLK1 to BLKz shown in FIG. 4 is exemplarily illustrated. The other memory blocks BLK2 to BLKz may have the same form as the first memory block BLK1.

The first memory block BLK1 may include a plurality of cell strings ST connected between bit lines BL1 to BLI and a source line SL. For example, the cell strings ST may be respectively connected to the bit lines BL1 to BLI, and be commonly connected to the source line SL. Since the cell strings ST are configured similarly to each other, a cell string ST connected to a first bit line BL1 among the cell strings ST will be described as an example.

The cell string ST may include a source select transistor SST, first to nth memory cells F1 to Fn (n is a positive integer), and a drain select transistor DST, which are connected in series to each other between the source line SL and the first bit line BL1. A number of source and drain select transistors SST and DST is not limited to that shown in FIG. 5. The source select transistor SST may be connected between the source line SL and the first memory cell F1. The first to nth memory cells F1 to Fn may be connected in series to each other between the source select transistor SST and the drain select transistor DST. The drain select transistor DST may be connected between the nth memory cell Fn and the first bit line BL1. Although not shown in the drawing, dummy cells may be further connected between the memory cells F1 to Fn or between the source select transistor SST and the drain select transistor DST.

Gates of source select transistors SST included in different cell strings ST may be connected to a source select line SSL, gates of first to nth memory cells F1 to Fn included in different cell strings ST may be connected to first to nth word lines WL1 to WLn, and gates of drain select transistors DST included in different cell strings ST may be connected to a drain select lines DSL. A group of memory cells connected to each of the word lines WL1 to WLn may be referred to as a page PG. For example, a group of first memory cells F1 connected to a first word line WL1 among memory cells F1 to Fn included in different strings may become one physical page PPG. Program and read operations may be performed in a physical page PPG unit.

Figure 6:
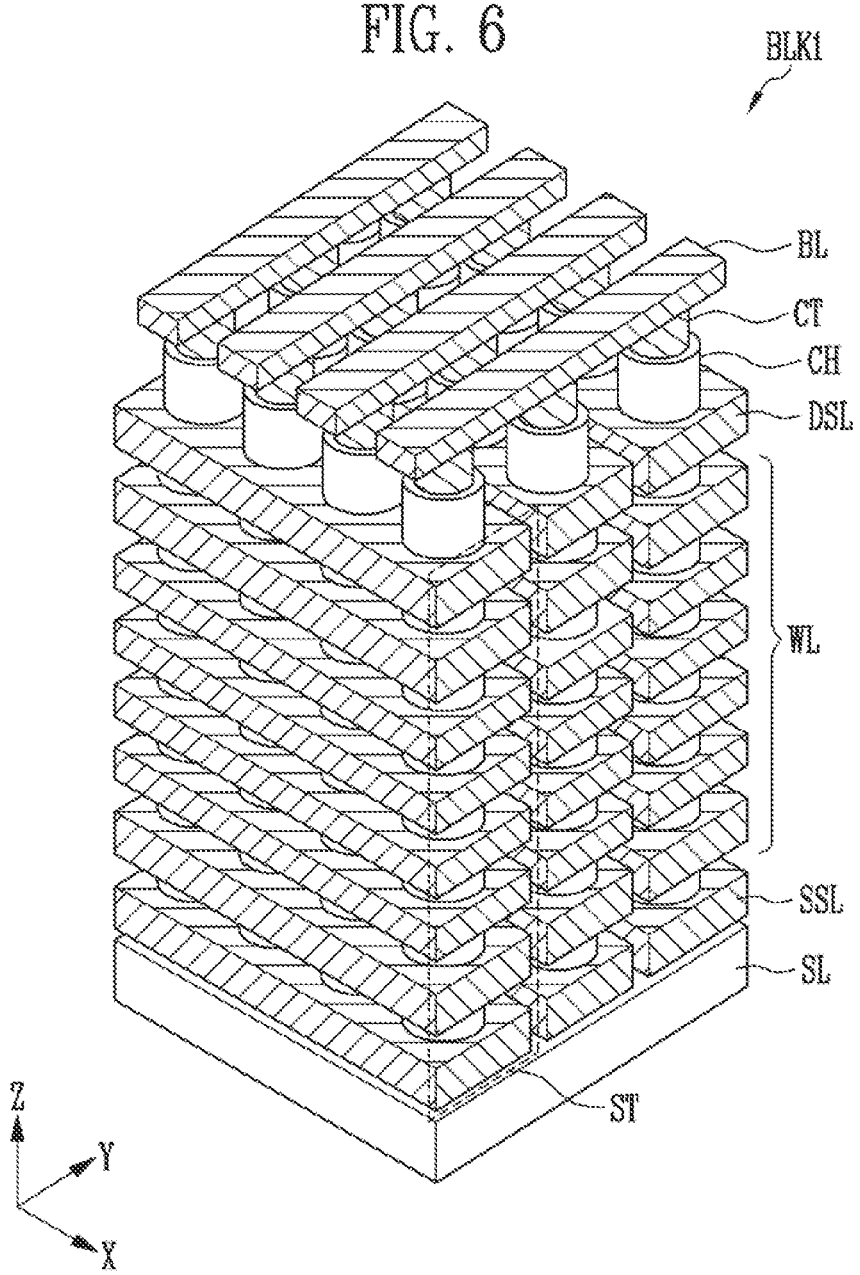
FIG. 6 is a diagram illustrating an embodiment in which the memory block shown in FIG. 4 is three-dimensionally configured.

FIG. 6 is a diagram illustrating an embodiment in which the memory block shown in FIG. 4 is three-dimensionally configured.

Referring to FIG. 6, the first memory block BLK1 among the plurality of memory blocks BLK1 to BLKz shown in FIG. 4 is exemplarily illustrated. The other memory blocks BLK2 to BLKz may have the same form as the first memory block BLK1.

The first memory block BLK implemented in a three-dimensional structure may be formed in a I shape in a vertical direction (Z direction) on a substrate, and include a plurality of cell strings ST arranged between bit lines BL and a source line SL. Alternatively, a well may be formed instead of the source line SL. This structure may also be referred to as a Bit Cost Scalable (BiCS) structure. For example, when the source line SL is horizontally formed above the substrate, the cell strings ST having the BiCS structure may be formed in the vertical direction (Z direction) above the source line SL.

For example, the cell strings ST may be arranged in a first direction (X direction) and a second direction (V direction). The cell strings ST may include source select lines SSL, word lines WL, and drain select lines DSL, which are stacked to be spaced apart from each other, A number of the source select lines SSL, the word lines WL, and the drain select lines DSL is not limited to that shown in the drawing, and may be changed according to the memory device 1100. The cell strings ST may include vertical channel layers CH vertically penetrating the source select lines SSL, the word lines WL, and the drain select lines DSL, and the bit lines BL which are in contact with the top of the vertical channel layers CH protruding upwardly of the drain select lines DSL and extend in the second direction (V direction). Memory cells may be formed between the word lines WL and the vertical channel layers CH. A contact plug CT may be further formed between the bit lines BL and the vertical channel layers CH.

Figure 7:
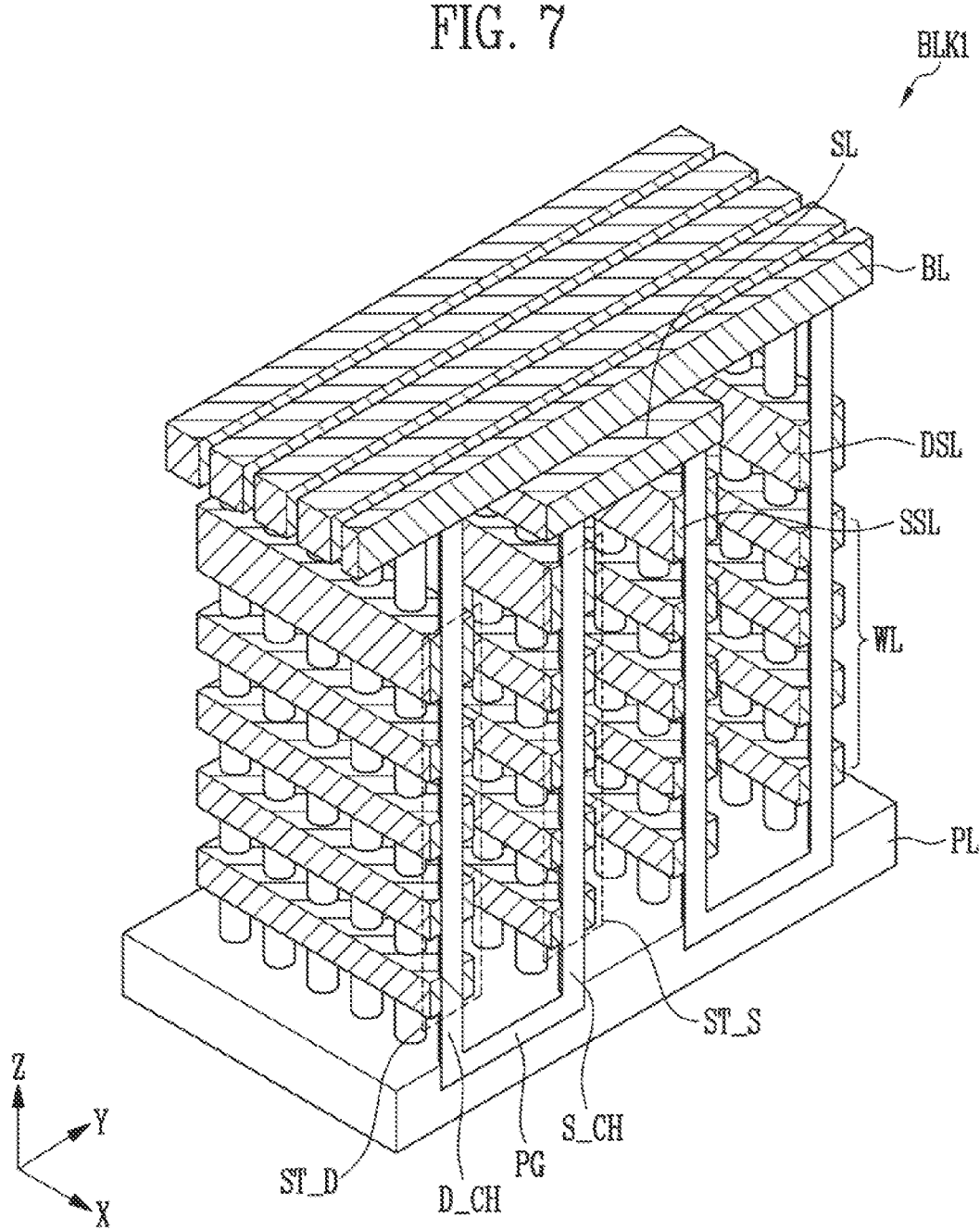
FIG. 7 is a diagram illustrating another embodiment in which the memory block shown in FIG. 4 is three-dimensionally configured.

FIG. 7 is a diagram illustrating another embodiment in which the memory block shown in FIG. 4 is three-dimensionally configured.

Referring to FIG. 7, the first memory block BLK1 among the plurality of memory blocks BLK1 to BLKz shown in FIG. 4 is exemplarily illustrated. The other memory blocks BLK2 to BLKz may have the same form as the first memory block BLK1.

The first memory block BLK1 implemented in a three-dimensional structure may be formed in a U shape in a vertical direction (Z direction) on a substrate, and include source strings ST_S and drain strings ST_D, which are connected between bit lines BL and a source line SL and form a pair. The source strings ST_S and the drain strings ST_D may be connected to each other through a pipe gate PG, to constitute a U structure. The pipe gate PG may be formed in a pipe line PL. More specifically, the source strings ST_S may be vertically formed between the source line SL and the pipe line PL, and the drain strings ST_D may be vertically formed between the bit lines BL and the pipe line PL. This structure may also be referred to as a Pipe-shaped Bit Cost Scalable (P-BiCS) structure.

For example, the drain strings ST_D and the source strings ST_S may be arranged in a first direction (X direction) and a second direction (Y direction), and be alternately arranged along the second direction (Y direction). The drain strings ST_D may include word lines WL and a drain select line DSL, which are stacked to be spaced apart from each other, and drain vertical channel layers D_CH vertically penetrating the word lines WL and the drain select line DSL. The source strings ST_S may include word lines and a source select lines SSL, which are stacked to be spaced apart from each other, and source vertical channel layers S_CH vertically penetrating the word lines WL and the source select line SSL. The drain vertical channel layers D_CH and the source vertical channel layers S_CH may be connected to each other by the pipe gate PG in the pipe line PL. The bit lines BL may in contact with the top of the drain vertical channel layers D_CH protruding upwardly of the drain select line DSL, and extend in the second direction (Y direction).

Figure 8:
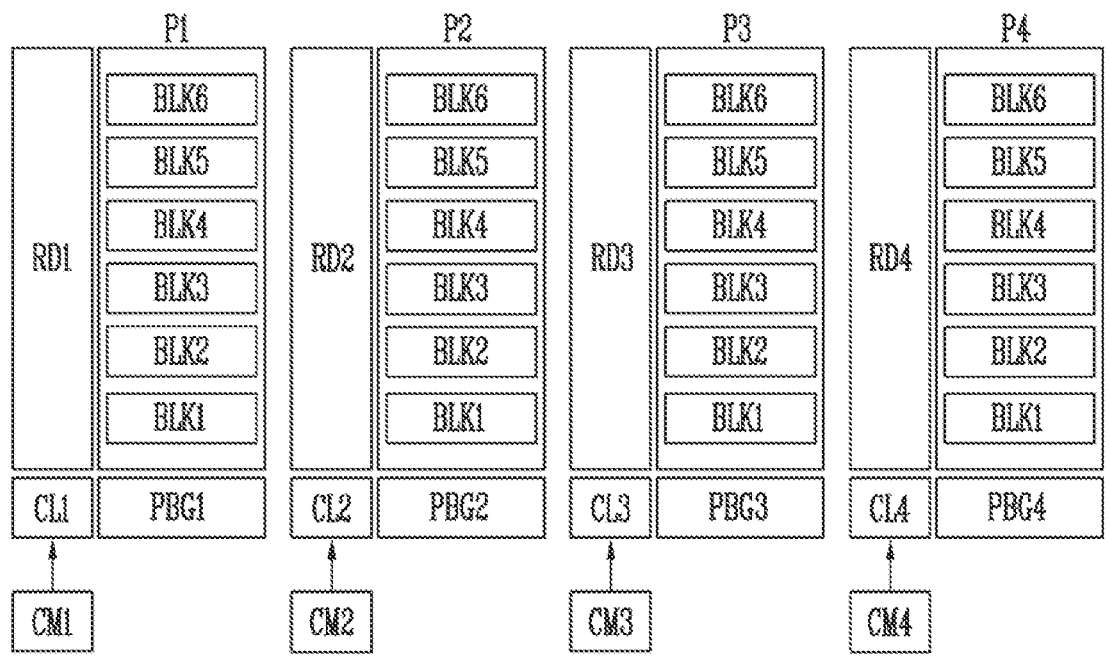
FIG. 8 is a diagram illustrating a multi-plane structure in the memory device shown in FIG. 1.

FIG. 8 is a diagram illustrating a multi-plane structure in the memory device shown in FIG. 1.

Referring to FIG. 8, the memory cell array 100 of the memory device 1100 may include a plurality of planes P1 to P4. For example, first to fourth planes P1 to P4 may be included in a memory cell array 100 in one memory device 1100.

The first to fourth planes P1 to P4 may be respectively connected to row decoders RD1 to RD4 and page buffer groups PBG1 to PBG4, and operate independently from each other. For example, the first plane P1 may be connected to a first row decoder RD1 and a first page buffer group PBG1 to operate, the second plane P2 may be connected to a second row decoder RD2 and a second page buffer group PGG2 to operate, the third plane P3 may be connected to a third row decoder RD3 and a third page buffer group PBG3 to operate, and the fourth plane RD4 may be connected to a fourth row decoder RD4 and a fourth page buffer group PBG4 to operate.

A read operation will be described as an example. Each of the first to fourth row decoders RD1 to RD4 may apply a read voltage to a selected memory block in each of the first to fourth planes P1 to P4 in response to a received row address. The first to fourth page buffer groups PBG1 to PBG4 may temporarily store read data by sensing voltages or currents of bit lines connected to the first to fourth planes P1 to P4. When sensing operations of the first to fourth planes P1 to P4 are all completed, the read data temporarily stored in the first to fourth page buffer groups PBG1 to PBG4 may be sequentially output through the input/output circuit 250. For example, after read data of the first page buffer group PBG1 is firstly output, read data of the second to fourth page buffer groups PBG2 to PBG4 may be sequentially output.

As shown in FIG. 8, the memory device 1100 including the plurality of planes P1 to P4 may simultaneously (or in parallel) perform a read, program or erase operation on blocks or pages, which are located in different planes. For example, the control logic 300 may perform a plane interleaving operation of simultaneously (or temporally overlapping) reading pages located in different planes. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Meanwhile, the control logic 300 may include independent control logics CL1 to CL4 respectively corresponding to the planes P1 to P4 to perform the plane interleaving operation. For example, a first control logic CL1 may control an operation on the first plane P1, a second control logic CL2 may control an operation on the second plane P2, a third control logic CL3 may control an operation on the third plane P3, and a fourth control logic CL4 may control an operation on the fourth plane P4. Therefore, the first to fourth row decoders RD1 to RD4 and the first to fourth page buffers PBG1 to PBG4 may be independently controlled respectively by the first to fourth control logics CL1 to CL4. In addition, at least some or the whole of the first to fourth control logics CL1 to CL4 may be integrated such that one control logic controls two or more planes.

Figure 9:
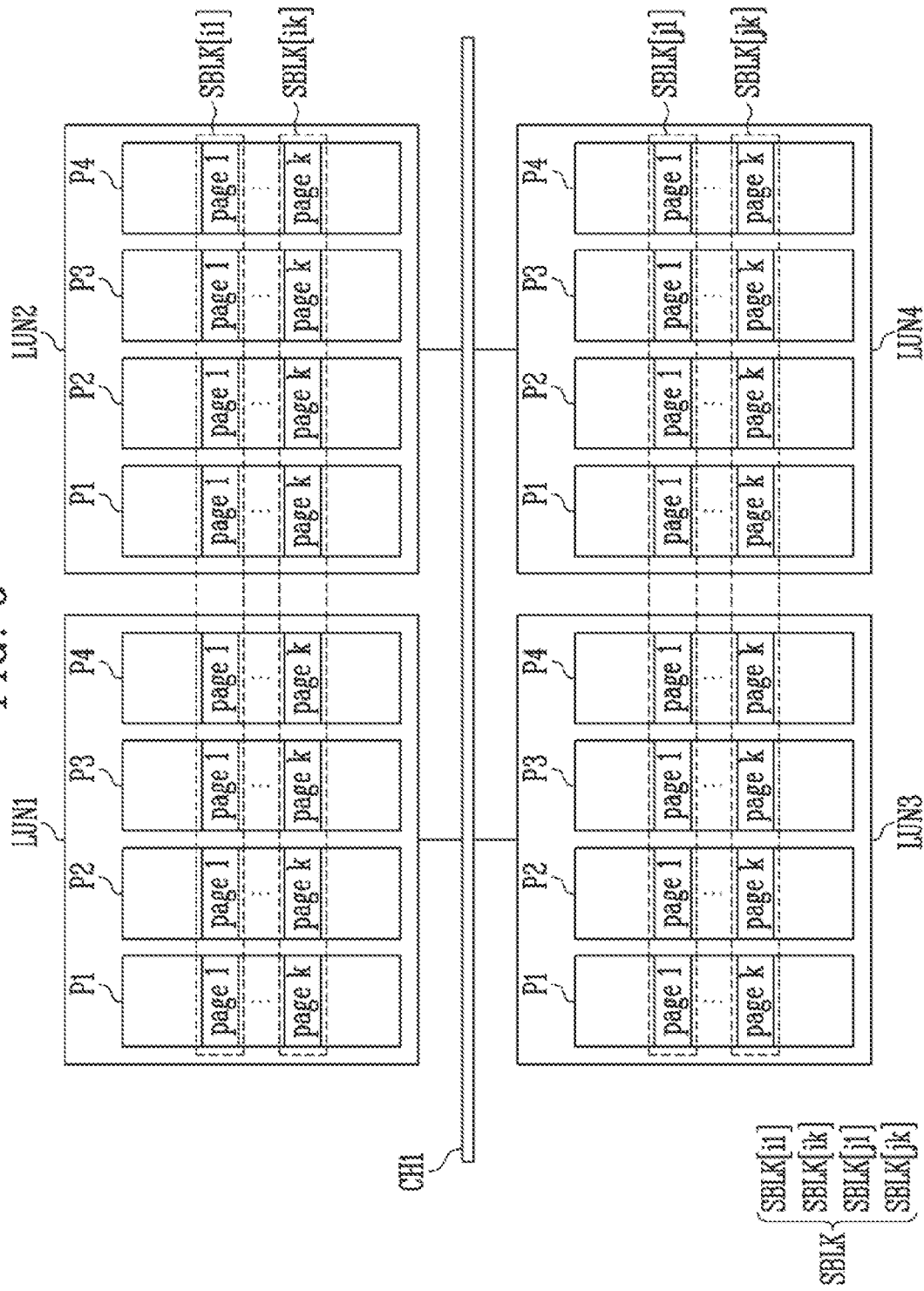
FIG. 9 is a conceptual diagram illustrating a super block in accordance with an embodiment of the present disclosure.

FIG. 9 is a conceptual diagram illustrating a super block in accordance with an embodiment of the present disclosure.

Referring to FIG. 9, memory devices 1100 may be connected to the memory controller 1200 through one first channel CH1. For example, a first memory device LUN1, a second memory device LUN2, a third memory device LUN3, and a fourth memory device LUN4 may be connected to the memory controller 1200 through the first channel CH1.

Meanwhile, pages included in a plurality of planes P1 to P4 which two or more memory devices have may constitute one super block SBLK. For example, first pages page 1 included in ith (i is a natural number of 1 or more) blocks belonging to first to fourth planes P1 to P4 of the first memory device LUN1 and the second memory device LUN2 may be configured as one super block SBLK[i1], and kth (k is a natural number of 2 or more) pages page k included in the ith blocks belonging to the first to fourth planes P1 to P4 of the first memory device LUN1 and the second memory device LUN2 may be configured as one super block SBLK[ik].

Like the first memory device LUN1 and the second memory device LUN2, first pages page 1 included in jth (j is a natural number of 1 or more) belonging to first to fourth planes P1 to P4 of the third memory device LUN3 and the fourth memory device LUN4 may be configured as one super block SBLK[j1], and kth (k is a natural number of 2 or more) pages page k included in the jth blocks belonging to the first to fourth planes P1 to P4 of the third memory device LUN3 and the fourth memory device LUN4 may be configured as one super block SBLK[jk].

Each of pages included in one super block SBLK may have the same column address and the same row address. For example, the first pages page 1 constituting the super block SBLK[i1] may have the same column address and the same row address in each plane. Similarly, the kth pages page k constituting the super block SBLK[ik] may have the same column address and the same row address in each plane.

Meanwhile, when a program operation or a read operation is performed on a super block SBLK configured with pages belonging to planes P1 to P4 of two or more memory devices, the memory controller 1200 may be requested to transmit a program command or a read command to each of the memory devices.

For example, when each of the first memory device LUN1 and the second memory device LUN2 includes four planes P1 to P4 as shown in FIG. 9, the memory controller 1200 may transmit, to the first memory device LUN1, four program commands (or read commands) respectively corresponding to the planes P1 to P4, and transmit, to the second memory device LUN2, four program commands (or read commands) respectively corresponding to the planes P1 to P4 to instruct a program operation (or read operation) on super blocks SBLK[i1] to SBLK[ik] configured by using the first memory device LUN1 and the second memory device LUN2.

As described above, when the memory controller 1200 transmits a plurality of commands to the first memory device LUN1 and the second memory device LUN2 to instruct a program operation (or read operation) on one super block SBLK, the memory controller 1200 may transmit the commands through an input/output pad DQ of the first channel all through which the first memory device LUN1 and the second memory device LUN2 are commonly connected. Therefore, the memory controller 1200 may sequentially transmit program commands corresponding to the first memory device LUN1 and program commands corresponding to the second memory device LUN2 through the input/output pad DQ of the first channel CH1.

Although a case where one super block SBLK is configured by using two memory devices LUN1 and LUN2, or LUN3 and LUN4 has been illustrated in FIG. 9, the present disclosure is not limited thereto. For example, one super block SBLK may be configured by using at least two memory devices connected through a common channel.

Figure 10:
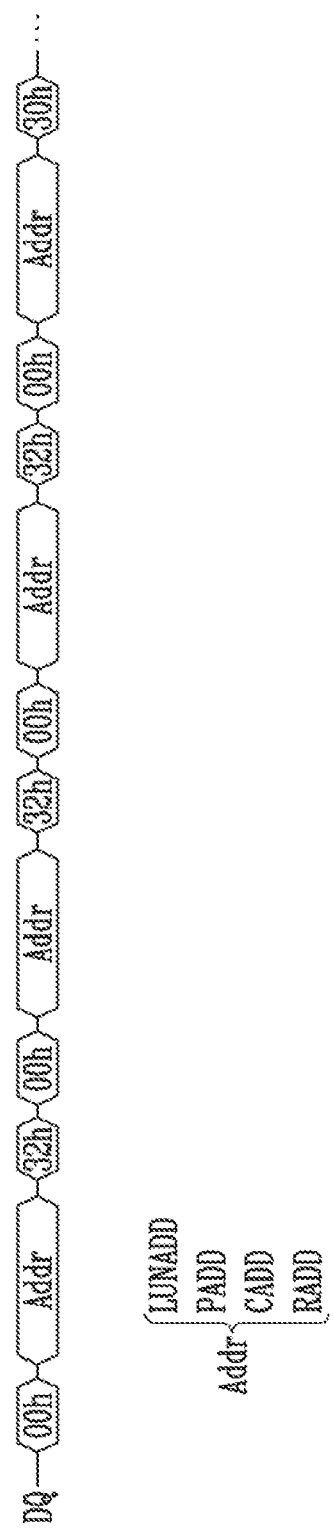
FIG. 10 is a timing diagram illustrating a read operation of reading pages included in the super block shown in FIG. 9.

FIG. 10 is a timing diagram illustrating a read operation of reading pages included in the super block shown in FIG. 9.

Referring to FIG. 10, the memory controller 1200 may sequentially transmit read commands instructing reading of pages included in the super block SB K[i1] to the input/output pad DQ of the first channel CH1.

For example, in order to instruct the first memory device LUN1 to perform a read operation on the super block SBLK[i1], the memory controller 1200 may sequentially transmit read commands respectively corresponding to the planes P1 to P4 of the first memory device LUN1 constituting the super block SBLK[i1], together with an address Addr, to the input/output pad DQ of the first channel CH1.

The address Addr may include a die address LUNADD indicating one of the memory devices LUN1 to LUN4 connected to the first channel CH1, a plane address PADD indicating one of the planes P1 to P4 of each memory device, and a column address CADD and a row address RADD, which indicate a page included in one of the planes.

Specifically, for example, the memory controller 1200 may transmit, to the input/output pad DQ of the first channel CH1, an address Addr including a the address LUNADD instructing the first memory device LUN1, a plane address PADD indicating the first plane P1, and a column address CADD and a row address RADD, which indicate a first page page 1, together with a read command 00h-32h. Also, the memory device 1200 may transmit, to the input/output pad DQ of the first channel CH1, an address Addr including the die address LUNADD instructing the first memory device LUN1, a plane address PADD indicating the second plane P2, and a column address CADD and a row address RADD, which indicate a first page page 1, together with a read command 00h-32h. Also, the memory device 1200 may transmit, to the input/output pad DQ of the first channel CH1, an address Addr including the die address LUNADD instructing the first memory device LUN1, a plane address PADD indicating the third plane P3, and a column address CADD and a row address RADD, which indicate a first page page 1, together with a read command 00h-32h. Also, the memory device 1200 may transmit, to the input/output pad DQ of the first channel CH1, an address Addr including the die address LUNADD instructing the first memory device LUN1, a plane address PADD indicating the fourth plane P4, and a column address CADD and a row address RADD, which indicate a first page page 1, together with a last command 00h-30h.

Since the die address LUNADD included in the four address Addr transmitted by the memory controller 1200 indicates the first memory device LUN1, the first memory device LUN1 may perform an operation according to the four read commands 00h-32h and 00h-30h transmitted to the input/output pad DQ of the first channel CH1.

Whenever the first memory device LUN1 receives the three read commands 00h-32h transmitted by the memory controller 1200 through the input/output pad DQ of the first channel CH1, the first memory device LUN1 may sequentially queue a read operation on the first page page 1 of the first plane P1, a read operation on the first page page 1 of the second plane P2, and a read operation on the first page page 1 of the third plane P3. When the first memory device LUN1 receives the last read command 00h-30h, the first memory device LUN1 may perform the queued read operations on the first pages page 1 of the first to third planes P1 to P3 and a read operation on the first page page 1 of the fourth plane P4, which is instructed by the last read command 00h-30h.

For example, the first memory device LUN1 may read the first pages page 1 of the first to fourth planes P1 to P4 by using a plane interleaving method, and store read data in the page buffer group 230 connected to each plane. For example, the first memory device LUN1 may store the read data in a cache register (not shown) included in the page buffer group 230.

The data stored in the page buffer group 230 of each plane may be sequentially transmitted to the memory controller 1200 as a response to a read enable signal transmitted to the first memory device LUN through the RE# pad.

Meanwhile, since the super block SBLK[i1] includes first pages page 1 included in the planes P1 to P4 of the second memory device LUN2, the memory controller 1200 may also transmit four read commands to the second memory device LUN2 through the input/output pad DQ of the first channel CH1.

For example, the memory controller 1200 may transmit, to the input/output pad DQ of the first channel CH1, an address Addr including a die address LUNADD indicating the second memory device LUN2, a plane address PADD indicating the first plane P1, and a column address CADD and a row address RADD, which indicate a first page paged 1, together with a read command 00h-32h. Also, the memory controller 1200 may transmit, to the input/output pad DQ of the first channel CH1, an address Addr including the die address LUNADD indicating the second memory device LUN2, a plane address PADD indicating the second plane P2, and a column address CADD and a row address RADD, which indicate a first page page 1, together with a read command 00h-32h. Also, the memory controller 1200 may transmit, to the input/output pad DQ of the first channel CH1, an address Addr including the die address LUNADD indicating the second memory device LUN2, a plane address PADD indicating the third plane P3, and a column address CADD and a row address RADD, which indicate a first page page 1, together with a read command 00h-32h. Also, the memory controller 1200 may transmit, to the input/output pad DQ of the first channel CH1, an address Addr including the die address LUNADD indicating the second memory device LUN2, a plane address PADD indicating the fourth plane P4, and a column address CADD and a row address RADD, which indicate a first page page 1, together with a last read command 00h-30h.

That is, the memory controller 1200 may transmit read commands respectively corresponding to planes of at least two memory devices constituting one super block SBLK, to read pages included in the one super block SBLK. For example, when one super block is configured with four planes and two memory devices as shown in FIG. 9, the memory controller 1200 may transmit eight read commands to read pages included in the one super block.

Figure 11:
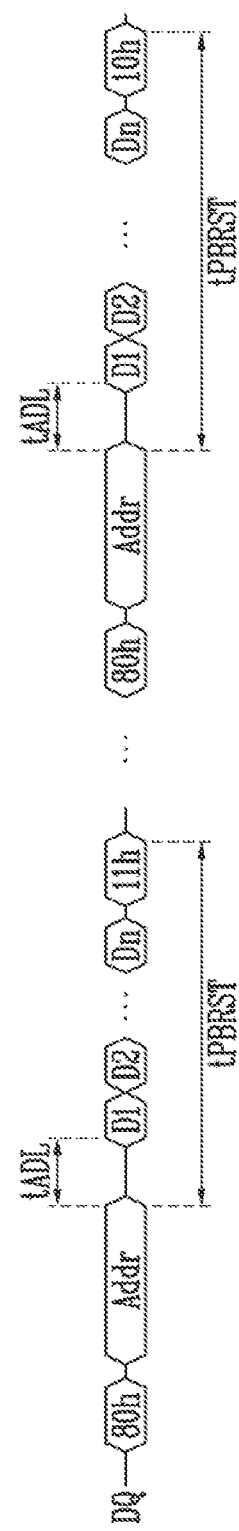
FIG. 11 is a timing diagram illustrating a program operation of programming data in the pages included in the super block shown in FIG. 9.

FIG. 11 is a timing diagram illustrating a program operation of programming data in the pages included in the super block shown in FIG. 9.

Referring to FIG. 11, the memory controller 1200 may sequentially transmit program commands instructing programming of data in pages included in the super block SBLK[i1] to the input/output pad DQ of the first channel CH1.

For example, in order to perform a program operation of programming data in the super block SBLK[i1], the memory controller 1200 may sequentially transmit, to the input/output pad DQ of the first channel CH1, program commands respectively corresponding to the planes P1 to P4 of the first memory device LUN1 constituting the super block SBLK [i1], together with an address Addr and data D1 to Dn.

The address Addr may include a die address LUNADD indicating one of the memory devices LUN1 to LUN4 connected to the first channel CH1, a plane address PADD indicating one of the planes P1 to P4 of each memory device, and a column address CADD and a row address RADD, which indicate a page included in one of the planes.

The data D1 to Dn may be data to be stored in memory cells indicated by the address Addr.

For example, referring to FIG. 11, the memory controller 1200 may transmit, to the input/output pad DQ of the first channel CH1, an address Addr including a die address LUNADD indicating the first memory device LUN1, a plane address PADD indicating the first plane P1, and a column address CADD and a row address RADD, which indicate the first page page 1, and data D1 to Dn, together with a program command 80h-11h.

Also, although omitted in FIG. 11, the memory controller 1200 may transmit, to the input/output pad DQ of the first channel CH1, an address Addr including the die address LUNADD indicating the first memory device LUN1, a plane address PADD indicating the second plane P2, and a column address CADD and a row address RADD, which indicate the first page page 1, and data D1 to Dn, together with a program command 80h-11h. Also, the memory controller 1200 may transmit, to the input/output pad DQ of the first channel CH1, an address Addr including the die address LUNADD indicating the first memory device LUN1, a plane address PADD indicating the third plane P3, and a column address CADD and a row address RADD, which indicate the first page page 1, and data D1 to Dn, together with a program command 80h-11h.

Also, referring to FIG. 11, the memory controller 1200 may transmit, to the input/output pad DQ of the first channel CH1, an address Addr including the die address LUNADD indicating the first memory device LUN1, a plane address PADD indicating the fourth plane P4, and a column address CADD and a row address RADD, which indicate the first page page 1, and data D1 to Dn, together with a last program command 80h-10h.

Since the die address LUNADD included in the four address Addr transmitted by the memory controller 1200 indicates the first memory device LUN1, the first memory device LUN1 may perform an operation according to the four program commands 80h-11h and 80h-10h transmitted to the input/output pad DQ of the first channel CH1.

Whenever the first memory device LUN1 receives the three program commands 80h-11h and the data D1 to Dn, which are transmitted by the memory controller 1200 through the input/output pad DQ of the first channel CH1, the first memory device LUN1 may store the received data in the page buffer group 230 of a plane corresponding to the plane address PADD. When the first memory device LUN1 receives the last program command 80h-10h and the data D1 to Dn, the first memory device LUN1 may store the data D1 to Dn received together with the last program command 80h-10h in the page buffer group 230 of the fourth plane P4, and then simultaneously (or temporally overlapping) store (or program) data respectively stored in the page buffer groups 230 of the first to fourth planes P1 to P4 in memory cells included in the first to fourth planes P1 to P4.

Meanwhile, the first memory device LUN1 may perform a reset operation (or initialization operation) on the page buffer group 230 connected to the plane corresponding to the plane address PADD in a data loading period tADL corresponding to a period from when the address Addr is received to when the data D1 to Dn are received. That is, the first memory device LUN1 may perform the reset operation on the page buffer group 230 connected to the plane corresponding to the plane address PADD before new data D1 to Dn are stored in the page buffer group 230, so that the cache register included in the page buffer group 230 is reset.

Meanwhile, since the super block SBLK[i1] includes first pages page 1 included in the planes P1 to P4 of the second memory device LUN2, the memory controller 1200 may also transmit four read commands and data to the second memory device LUN2 through the input/output pad DQ of the first channel CH1.

For example, the memory controller 1200 may transmit, to the input/output pad DQ of the first channel CH1, an address Addr including a die address LUNADD indicating the second memory device LUN2, a plane address PADD indicating the first plane P1, and a column address CADD and a row address RADD, which indicate the first page page 1, and data D1 to Dn, together with a program command 80h-11h.

Also, although omitted in FIG. 11, the memory controller 1200 may transmit, to the input/output pad DQ of the first channel CH1, an address Addr including the die address LUNADD indicating the second memory device LUN2, a plane address PADD indicating the second plane P2, and a column address CADD and a row address RADD, which indicate the first page page 1, and data D1 to Dn, together with a program command 80h-11h. Also, the memory controller 1200 may transmit, to the input/output pad DQ of the first channel CH1, an address Addr including the die address LUNADD indicating the second memory device LUN2, a plane address PADD indicating the third plane P3, and a column address CADD and a row address RADD, which indicate the first page page 1, and data D1 to Dn, together with a program command 80h-11h.

Also, referring to FIG. 11, the memory controller 1200 may transmit, to the input/output pad DQ of the first channel all, an address Addr including the die address LUNADD indicating the second memory device LUN2, a plane address PADD indicating the fourth plane P4, and a column address CADD and a row address RADD, which indicate the first page page 1, and data D1 to Dn, together with a last program command 80h-10h.

That is, the memory controller 1200 may transmit program commands respectively corresponding to planes of at least two memory devices constituting one super block SBLK, to store data in pages included in the one super block SBLK. For example, when one super block is configured with four planes and two memory devices as shown in FIG. 9, the memory controller 1200 may transmit eight read commands to store data in pages included in the one super block.

Figure 12:
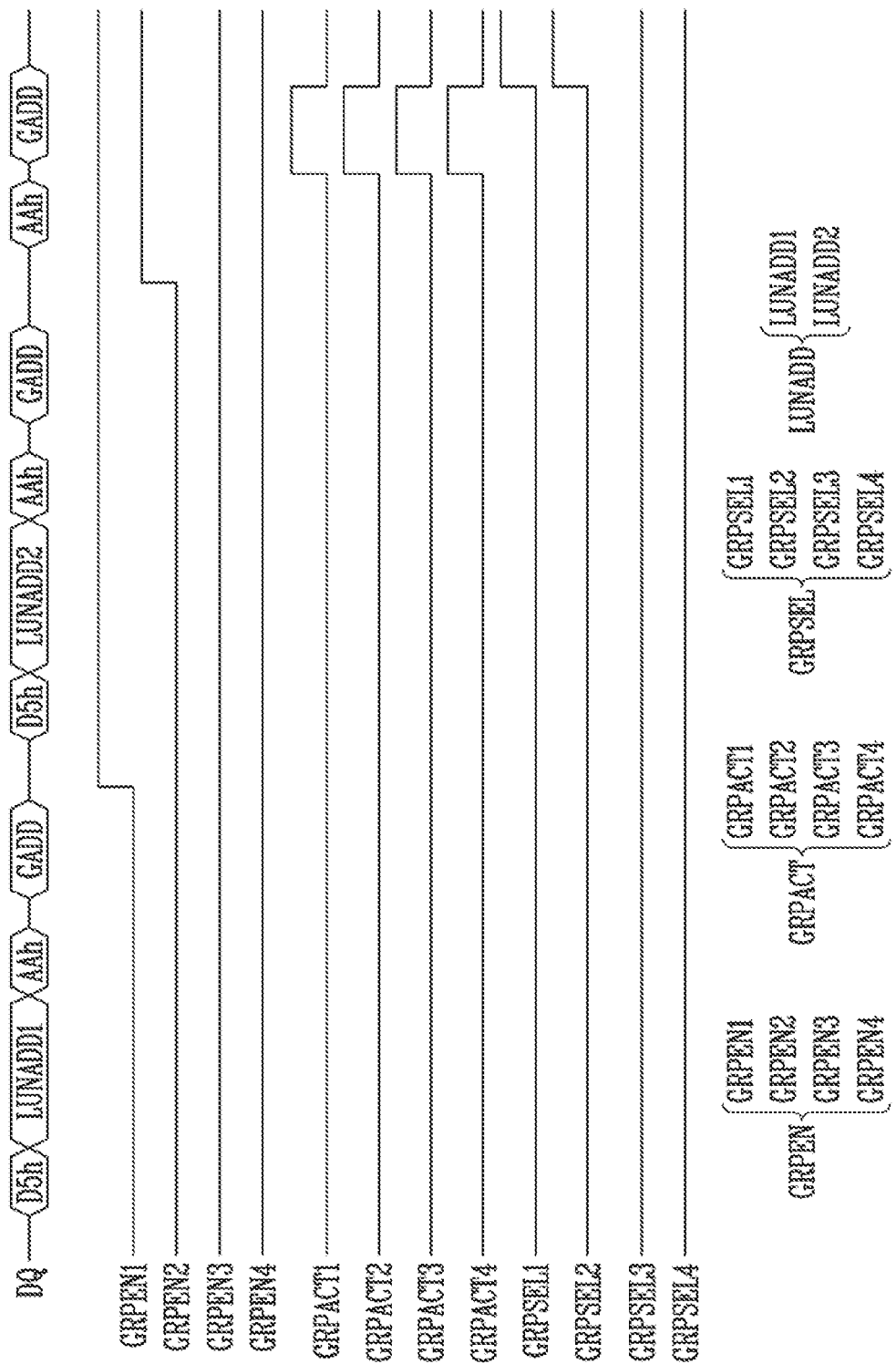
FIG. 12 is a timing diagram illustrating a concept of minimizing command transmission by selecting at least two memory devices constituting the super block shown in FIG. 9, using a group address.

FIG. 12 is a timing diagram illustrating a concept of minimizing command transmission by selecting at least two memory devices constituting the super block shown in FIG. 9, using a group address.

In the case of the read commands shown in FIG. 10, read commands respectively corresponding to planes of memory devices constituting a super block SBLK, may be transmitted to an input/output pad DQ of one channel. Therefore, a plurality of commands are to be sequentially transmitted to one channel to read one super block SBLK, which may cause a channel bottleneck. Accordingly, it may be required to perform a read operation on the super block SBLK by transmitting only a minimized number of read commands to solve the channel bottleneck.

Also, in the case of each of the program commands shown in FIG. 11, a reset operation (or initialization operation) may be performed on the page buffer group 230 connected to the plane corresponding to the plane address PADD in the data loading period tADL corresponding to a period from when the address Addr is received to when the data D1 to Dn are received. That is, when the program command is issued eight times, it is necessary to secure eight data loading periods tADL. In order to reduce the data loading period tADL, when a first program command is issued, the reset operation is simultaneously performed on all the page buffer groups 230 connected to planes of each of the memory devices constituting a super block, so that the data loading periods tADL according to the other program commands can be omitted. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

In accordance with an embodiment for solving the channel bottleneck and reducing the data loading period, the memory controller 1200 may allocate the same group address GADD to at least two memory devices constituting a super block SBLK, and select the at least two memory devices constituting the super block SBLK by using the group address GADD.

The selected at least two memory devices may performing a read operation corresponding to a read command, regardless of any die address LUNADD, in response to the read command. Also, the selected at least two memory devices may perform a read operation corresponding to a read command on all planes constituting the super block SBLK, regardless of any plane address PADD, in response to the read command.

In addition, the selected at least two memory devices may simultaneously perform a reset operation on all the page buffer groups 230 connected to all the planes P1 to P4 constituting the super block SBLK in response to a first program command. Also, the selected at least two memory devices may omit the data loading period tADL (i.e., omit the reset operation on the page buffer group 230) as a response to a program command after the first program command.

In the timing diagram shown in FIG. 12, although that a high level signal is output is expressed as that a signal is output (or activated), and that a low level signal is output is expressed as that any signal is not output, it should be understood that this is for convenience of description only. For example, on the contrary, that the low level signal is output may be expressed as that a signal is output. In addition, it may be construed that the high level signal and the low level signal represent relative magnitudes (e.g., relative magnitudes of voltage).

For example, referring to FIG. 12, the memory controller 1200 may transmit, to the input/output pad DQ of the first channel CH1, group address allocation commands D5h-AAh for allocating a group address GADD to the first memory device LUN1 and the second memory device LUN2, which constitute the super block SBLK[i1].

First, the memory controller 1200 may transmit a group address allocation command D5h-AAh and a die address LUNADD1 indicating the first memory device LUN1 to the input/output pad DQ of the first channel CH1, and transmit a group address GADD to be allocated to the first memory device LUN1 to the input/output pad DQ of the first channel CH1.

The first memory device LUN1 corresponding to the die address LUNADD1 or the control logic 300 of the first memory device LUN1 may store the group address GADD in the group address register 500 thereof and output a high-level group allocation enable signal GRPEN1, in response to the group address allocation command D5h-AAh transmitted to the input/output pad DQ.

The memory controller 1200 may transmit a group address allocation command D5h-AAh and a die address LUNADD2 indicating the second memory device LUN2 to the input/output pad DQ of the first channel CH1, and transmit a group address GADD to be allocated to the second memory device LUN2 to the input/output pad DQ of the first channel CH1.

The second memory device LUN2 corresponding to the die address LUNADD2 or the control logic 300 of the second memory device LUN2 may store the group address GADD in the group address register 500 thereof and output a high-level group allocation enable signal GRPEN2, in response to the group address allocation command D5h-AAh transmitted to the input/output pad DQ.

The third memory device LUN3 and the fourth memory device LUN4 are connected to the first channel CH1, but do not have any allocated group address GADD to be stored therein. Hence, the third memory device LUN3 and the fourth memory device LUN4 might not output high-level group allocation enable signals GRPEN3 and GRPEN4.

After group addresses GADD are allocated to the first memory device LUN1 and the second memory device LUN2, which constitute the super block SBLK[i1], the memory controller 1200 may transmit, to the input/output pad DQ of the first channel CH1, group selection commands AAh for selecting the first memory device LUN1 and the second memory device LUN2, which constitute the super block SBLK[i1], together with the group addresses GADD.

The control logics 300 of the first to fourth memory devices LUN1 to LUN4 connected to the first channel CH1 may output high-level first group activation signals GRPACT1 to GRPACT4 as a response to that the control logics 300 have received the group selection commands AAh.

Also, the control logics 300 of the first to fourth memory devices LUN1 to LUN4 connected to the first channel CH1 may compare the group addresses GADD transmitted together with the group selection commands AAh with the group addresses GADD stored in the group address registers 500 of the first to fourth memory devices LUN1 to LUN4. The control logics 300 of the first memory device LUN1 and the second memory device LUN2 may determine that two group addresses GADD are the same, based on a comparison result, and generate second group activation signals GADDSIG (see FIG. 15). Meanwhile, since any group address GADD is not stored in the group address registers 500 of the third memory device LUN3 and the fourth memory device LUN4, the control logics 300 of the third memory device LUN3 and the fourth memory device LUN4 may determine that two group addresses GADD are different from each other, and might not output second group activation signals GADDSIG (see FIG. 15).

Next, the group selection signal generators 400 of the first to fourth memory devices LUN1 to LUN4 may output a group selection signal GRPSEL, based on first group activation signals GRPACT, second group activation signals GADDSIC, and group allocation enable signals GRPEN.

For example, the group selection signal generator 400 of the first memory device LUN1 and the second memory device LUN2 may output high-level group selection signals GRPSEL1 and GRPSEL2, based on high-level first group activation signals GRPACT1 and GRPACT2, high-level second group activation signals, and high-level group allocation enable signals GRPEN1 and GRPEN2. The high-level group selection signals GRPSEL1 and GRPSEL2 output herein may be respectively received by the control logic 300 of the first memory device LUN1 and the control logic 300 of the second memory device LUN2.

However, the group selection signal generators 400 of the third memory device LUN3 and the fourth memory device LUN4 might not output high-level group selection signals GRPSEL3 and GRPSEL4, based on low-level group allocation enable signals GRPEN3 and GRPEN4 and/or low-level second group activation signals.

Finally, the control logic 300 of the first memory device LUN1 and the control logic 300 of the second memory device LUN2 may perform a program operation (or read operation) corresponding to a program command (or read command) transmitted through the first channel CH1 in response to the program command (or read command), based on the high-level group selection signal GRPSEL.

Figure 13:
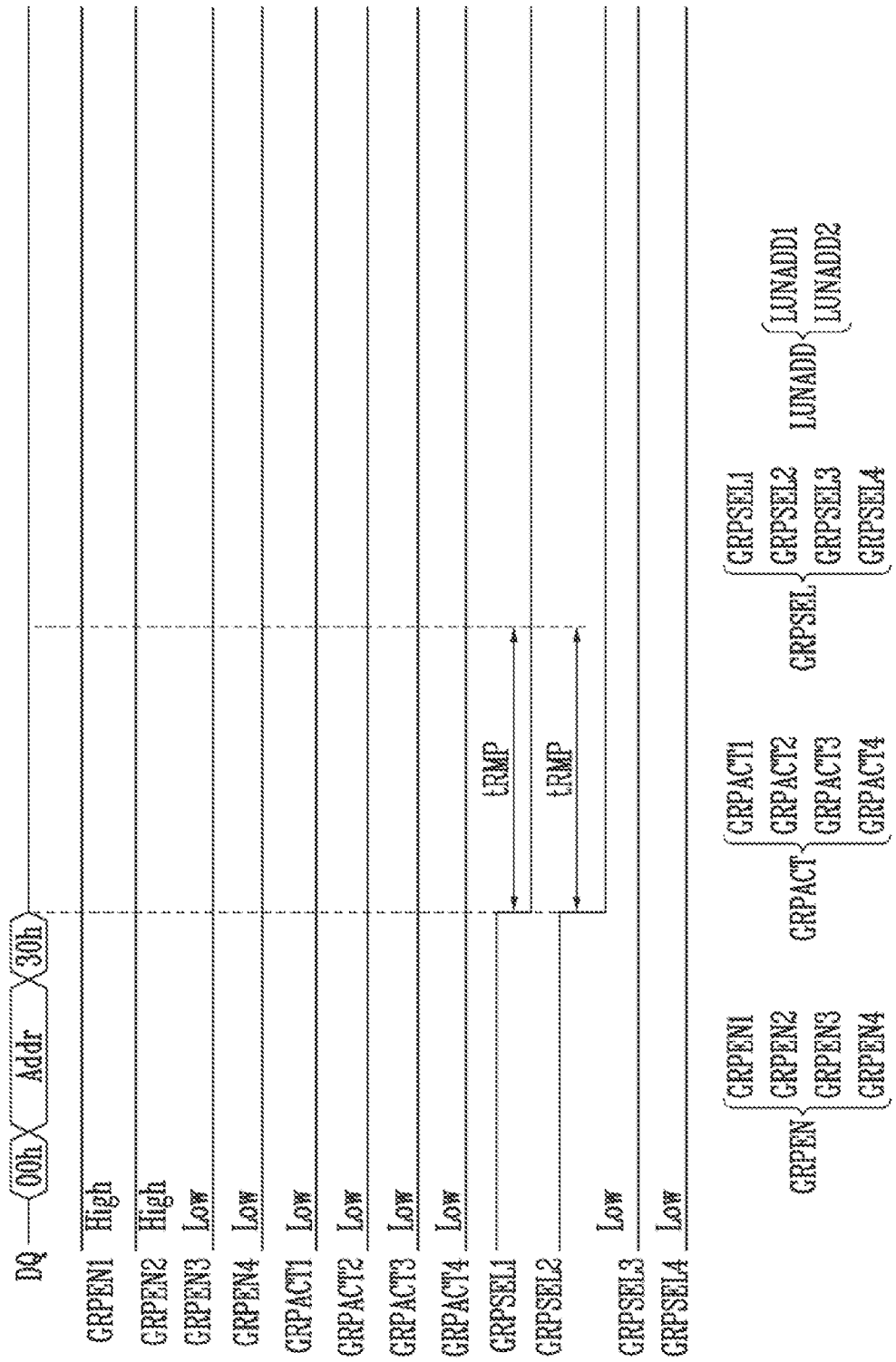
FIG. 13 is a timing diagram illustrating a case where a read command is received after at least two memory devices constituting the super block are selected as shown in FIG. 12.

FIG. 13 is a timing diagram illustrating a case where a read command is received after at least two memory devices constituting the super block are selected as shown in FIG. 12.

After the high-level group selection signals GRPSEL1 and GRPSEL2 are output from the group selection signal generators 400 of the first memory device LUN1 and the second memory device LUN2 in FIG. 12, a read command may be received. For example, referring to FIG. 13, the memory controller 1200 may transmit a read command 00h-30h and an address Addr to the input/output pad DQ of the first channel CH1.

As described in FIGS. 10 and 11, the address Addr may include a die address LUNADD indicating one of the memory devices LUN1 to LUN4 connected to the first channel CH1, a plane address PADD indicating one of the planes P1 to P4 of each memory device, and a column address CADD and a row address RADD, which indicate a page included in the one of the planes.

The control logics 300 of the first memory device LUN1 and the second memory device LUN2 respond to the read command 00h-30h, regardless of the die address LUNADD included in the address Addr, as a response to that the control logics 300 of the first memory device LUN1 and the second memory device LUN2 have received the high-level group selection signals GRPSEL1 and GRPSEL2, so that control logics 300 of the first memory device LUN1 and the second memory device LUN2 can perform a read operation corresponding to the read command 00h-30h transmitted to the input/output pad DQ by controlling the peripheral circuit 200. That is, although the die address LUNADD included in the address Addr indicates the first memory device LUN1, the control logic 300 of the second memory device LUN2, which receives the high-level group selection signal GRPSEL2, may perform the read operation corresponding to the read command 00h-30h.

The control logics 300 of the first memory device LUN1 and the second memory device LUN2 may perform the read operation corresponding to the read command 00h-30h on all the first to fourth planes P1 to P4 constituting the super block SBLK, regardless of the plane address PADD included in the address Addr, as a response to that the control logics 300 of the first memory device LUN1 and the second memory device LUN2 have received the high-level group selection signals. For example, each of the control logics 300 of the first memory device LUN1 and the second memory device LUN2 may read the first page page 1 indicated by the column address CADD and the row address LADD, which are included in the address Addr, in each of the first to fourth planes P1 to P4 of the first memory device LUN1 and the second memory device LUN2 by controlling the peripheral circuit 200, and store read data in the page buffer group 230 connected to each plane. The operation of reading the first page page 1 in the planes P1 to P4 of the first memory device LUN1 and the second memory device LUN2 may be performed during a 4-plane read period tRMP.

Meanwhile, since the control logics 300 of the third memory device LUN3 and the fourth memory device LUN4 receive low-level group selection signals, the control logics 300 of the third memory device LUN3 and the fourth memory device LUN4 may operate as described in FIG. 10. That is, each of the control logics 300 of the third memory device LUN3 and the fourth memory device LUN4 may read a page of a plane corresponding to the plane address PADD only when the die address LUNADD transmitted together with the read command 00h-30h indicates each of the third memory device LUN3 and the fourth memory device LUN4.

As described above, when at least two memory devices constituting a super block are selected as shown in FIG. 12, a read operation can be performed on all the planes P1 to P4 of the memory devices LUN1 and LUN2 constituting the super block SBLK[i1] by using one read command 00h-30h. That is, since the read command 00h-30h is issued once when one super block SBLK is read, a channel bottleneck can be solved, and a command processing time can be reduce.

Figure 14:
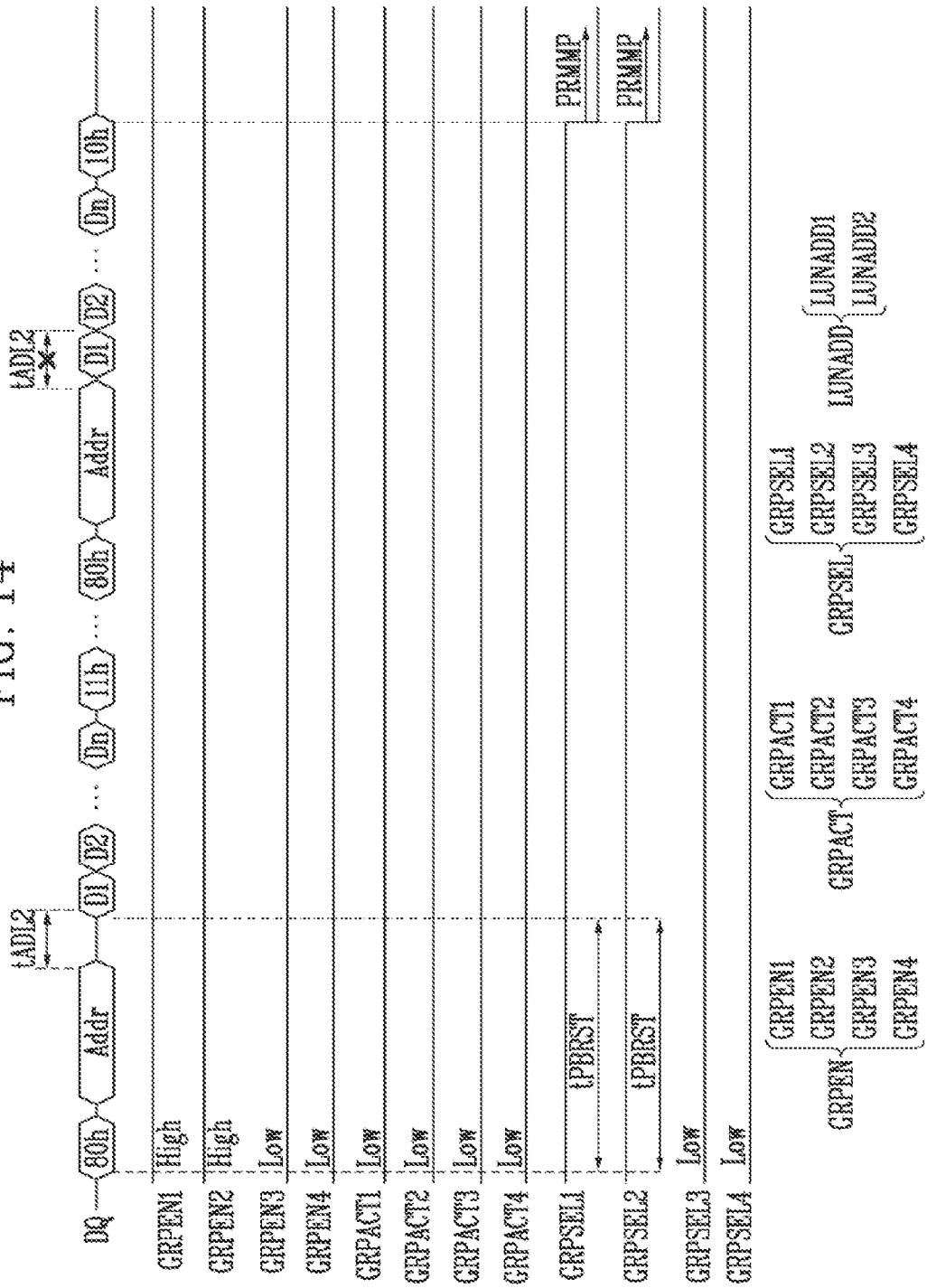
FIG. 14 is a timing diagram illustrating a case where a program command is received after at least two memory devices constituting the super block are selected as shown in FIG. 12.

FIG. 14 is a timing diagram illustrating a case where a program command is received after at least two memory devices constituting the super block are selected as shown in FIG. 12.

After the high-level group selection signals GRPSEL1 and GRPSEL2 are output from the group selection signal generators 400 of the first memory device LUN1 and the second memory device LUN2 in FIG. 12, a first program command may be received. For example, referring to FIG. 14, the memory controller 1200 may transmit a first program command 80h-11h, an address Addr, and data D1 to Dn to the input/output pad DQ of the first channel CH1.

The control logics 300 of the first memory device LUN1 and the second memory device LUN2 may perform a reset operation on all the page buffer groups 230 connected to all the planes P1 to P4 constituting the super block SBLK, in response to the first program command 80h-11h as a response to that the control logics 300 of the first memory device LUN1 and the second memory device LUN2 have received the high-level group selection signals GRPSEL1 and GRPSEL2. For example, when it is checked that a front-end command 80h of the first program command 80h-11h has been received, the control logics 300 of the first memory device LUN1 and the second memory device LUN2 may immediately perform the reset operation on all the page buffer groups 230 connected to all the planes P1 to P4 constituting the super block SBLK during a reset period tPBRST. That is, since the reset operation on all the page buffer groups 230 connected to all the planes P1 to P4 constituting the super block SBLK can be started without referring to the address Addr, the reset operation can be rapidly ended. Thus, a data loading period tADL2 shorter than the data loading period tADL shown in FIG. 11 can be set.

The data D1 to Dn may be stored in the page buffer group 230 connected to a plane of a memory device indicated by the address Addr among the first to fourth memory devices LUN1 to LUN4. For example, the data D1 to Dn may be stored in the page buffer group 230 connected to the first plane P1 of the first memory device LUN1.

When the memory controller 1200 transmits, to the input/output pad DQ of the first channel CH1, program commands 80h-11h (program command from a second program command) (not shown) after the first program command 80h-11h, addresses Addr, and data D1 to Dn, all reset operations on the page buffer groups 230 connected to planes of memory devices corresponding to the addresses Addr may be omitted (since the reset operation on all the page buffer groups 230 corresponding to the super block SBLK as a response to the first program command). That is, the memory controller 1200 may transmit the address Addr to the input/output pad DQ, and immediately transmit the data D1 to Dn to the input/output pad DQ without delaying during the data loading period tADL2. Even in response to the program commands 80h-11h (program command from a second program command) (not shown) after the first program command 80h-11h, the data D1 to Dn may be stored in the page buffer group 230 connected to a plane of a memory device indicated by the address Addr among the first to fourth memory devices LUN1 to LUN4.

Meanwhile, when the memory controller 1200 transmits a last program command 80h-10h, an address Addr, and data D1 to Dn to the input/output pad DQ of the first channel CH1, the data D1 to Dn may be stored in the page buffer group 230 connected to a plane of a memory device indicated by the address Addr among the first to fourth memory devices LUN1 to LUN4. Subsequently, the data stored in the page buffer groups 230 corresponding to the addresses Addr from the first program command 80h-11h to the last program command 80h-10h may be respectively stored in pages indicated by column addresses CADD and low addresses RADD, which are included in the addresses Addr.

Figure 15:
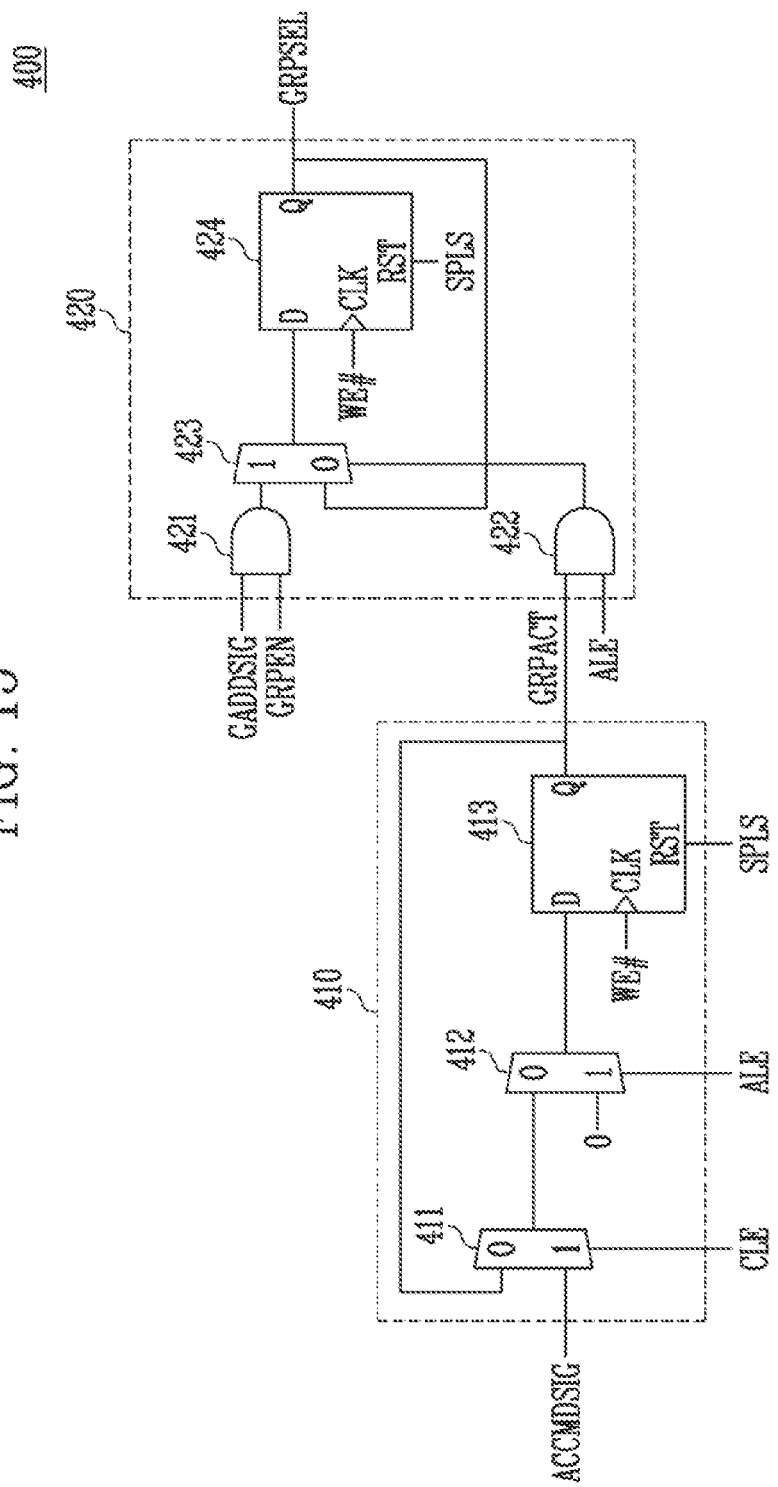
FIG. 15 is an example of a diagram illustrating a group selection signal generator shown in FIG. 3.

FIG. 15 is an example of a diagram illustrating the group selection signal generator shown in FIG. 3.

Referring to FIG. 15, the group selection signal generator 400 may include a first signal generator 410 which outputs a first group activation signal GRPACT as a response to a command receiving signal ACCMDSIG indicating that a group selection command AAh has been received, and a second signal generator 420 which outputs a group selection signal GRPSEL as a response to the first group activation signal GRPACT, a second group activation signal GADDSIG, and a group avocation enable signal GRPEN.

The second group activation signal GADDSIG may indicate that a group address stored in the group address register 500 and a group address received together with the group selection command AAh are the same.

The group allocation enable signal GRPEN may indicate that a group address GADD has been received.

The first signal generator 410 may include a first multiplexer 411 which selects and outputs one of the command receiving signal ACCMDSIG and the first group activation signal GRPACT, based on the command latch enable signal supplied to the CLE pad, a second multiplexer 412 which selects and outputs one of an output of the first multiplexer 411 and a low level signal 0, based on the address latch enable signal supplied to the ALE pad, and a first flip flop 413 which outputs an output of the second multiplexer 412 according to a clock CLK of the write enable signal supplied through the WE# pad. An output of the first flip flop 413 may be the first group activation signal GRPACT.

The first flip flop 413 may be a D-flip flop. Also, the first flip flop 413 may be reset according to a start pulse signal SPLS. For example, the start pulse signal SPLS may be a high level signal which appears for a short period of time after the read commands 00h-30h and the addresses Addr, which are shown in FIG. 3, are all received or after the last read command 0h-10h, the address Addr, and the data D1 to Dn, which are shown in FIG. 14, are all received.

The second signal generator 420 may include a first AND gate 421 which performs a logic AND operation on the second group activation signal GADDSIG and the group allocation enable signal GRPEN and then outputs a result of the logic AND operation, a second AND gate 422 which performs a logic AND operation on the first group activation signal GRPACT and the address latch enable signal supplied through the ALE pad and then outputs a result of the logic AND operation, a third multiplexer 423 which outputs a signal selected from an output of the first AND gate 421 and the group selection signal GRPSEL, based on an output of the second AND gate 422, and a second flip flop 424 which outputs an output of the third multiplexer 423 according to a clock CLK of the write enable signal supplied through the WE# pad. An output of the second flip flop 424 may be the group selection signal GRPSEL. The second flip flop 424 may be a D-flip flop. Also, the second flip flop 424 may be reset according to a start pulse signal SPLS.

The start pulse signal SPLS, the command receiving signal ACCMDSIG, the second group activation signal GADDSIG, and the group allocation enable signal GRPEN may be generated by the control logic 300 or a separate signal generating circuit.

Figure 16:
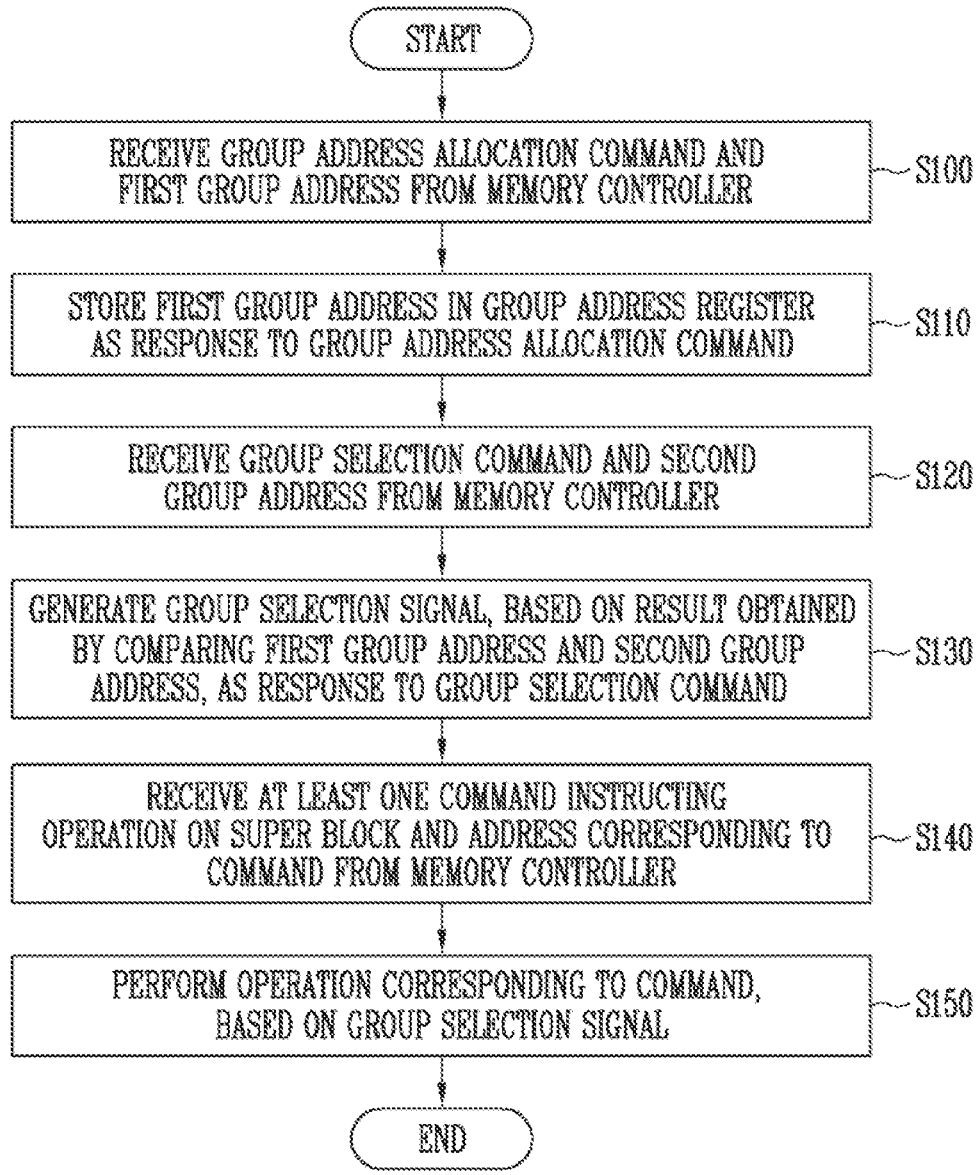
FIG. 16 is an example of a flowchart illustrating a method of operating the memory device described with reference to FIGS. 9 to 15.

FIG. 16 is an example of a flowchart illustrating a method of operating the memory device described with reference to FIGS. 9 to 15.

Referring to FIG. 16, the method for operating the memory device may include step S100 of receiving a group address allocation command and a first group address from the memory controller, step S110 of storing the first group address in the group address register as a response to the group address allocation command, step S120 of receiving a group selection command and a second group address from the memory controller, step S130 of generating a group selection signal, based on a result obtained by comparing the first group address and the second group address, as a response to the group selection command, step S140 of receiving at least one command instructing an operation on a super block and an address corresponding to the command from the memory controller, and step S150 of performing an operation corresponding to the command, based on the group selection signal.

The super block may include pages included in planes of at least two memory devices among a plurality of memory devices commonly connected to the memory controller through one channel.

The command may include a read command.

The step S150 of performing the operation may include step of performing a read operation corresponding to the read command by responding to the read command, based on the group selection signal.

The step of performing the read operation may include step of performing the read command corresponding to the read operation on the planes included in the super block, based on the group selection signal.

The first group address may be an address commonly allocated with respect to the at least two memory devices each including pages included in the super block.

The step S120 of receiving the group selection command and the second group address from the memory controller may include step of generating a first group activation signal indicating that the group selection command has been received.

The step S130 of generating the group selection signal may include step of generating a second group activation signal indicating that the first group address and the second group address are the same.

The step S110 of storing the first group address in the group address register may further include step of generating a group allocation enable signal indicating that a group address has been allocated.

In the step S130 of generating the group selection signal, the group selection signal may be generated based on the first group activation signal, the second group activation signal, and the group allocation enable signal.

The command may include a program command.

The step S140 of receiving the at least one command and the address corresponding to the command may include step of receiving the program command and performing a reset operation on memory buffer groups connected to the planes constituting the super block, before the address is received.

In addition, it should be construed that the method for operating the memory device includes the operations of the memory device 1100, which are described with reference to FIGS. 12 to 15.

Figure 17:
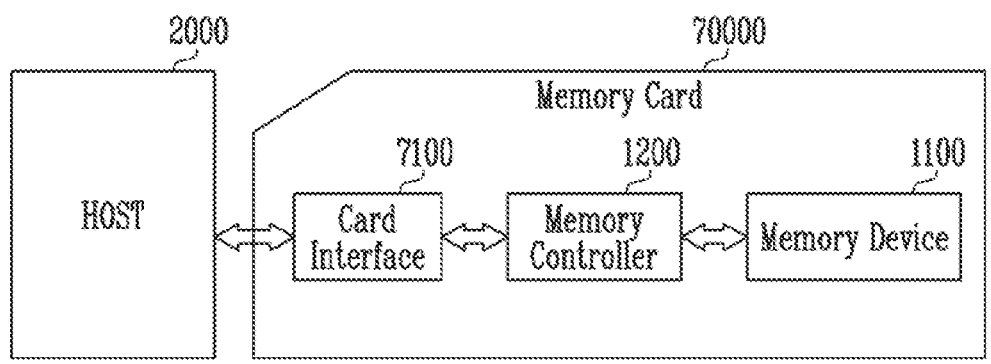
FIG. 17 is a diagram illustrating a memory card to which the memory system shown in FIG. 1 is applied.

FIG. 17 is a diagram illustrating a memory card to which the memory systems shown in FIG. 1 are applied.

Referring to FIG. 17, the memory system nay include a host 2000 and a memory card 70000.

The memory card 70000 may be implemented as a smart card. The memory card 70000 may include a memory device 1100, a memory controller 1200, and a card interface 7100.

The memory controller 1200 may control exchange of data between the memory device 1100 and the card interface 7100. In an embodiment, the card interface 7100 may be a secure digital (SD) interface or a mufti-media card (MMC) interface, but the present disclosure is not limited thereto.

The card interface 7100 may interface data exchange between the host 2000 and the memory controller 1200 according to a protocol of the host 2000. In some embodiments, the card interface 7100 may support a universal serial bus (USB) protocol and an inter-chip (IC)-USB protocol. The card interface 7100 may mean hardware capable of supporting a protocol used by the host 2000, software embedded in the hardware, or a signal transmission method.

Figure 18:
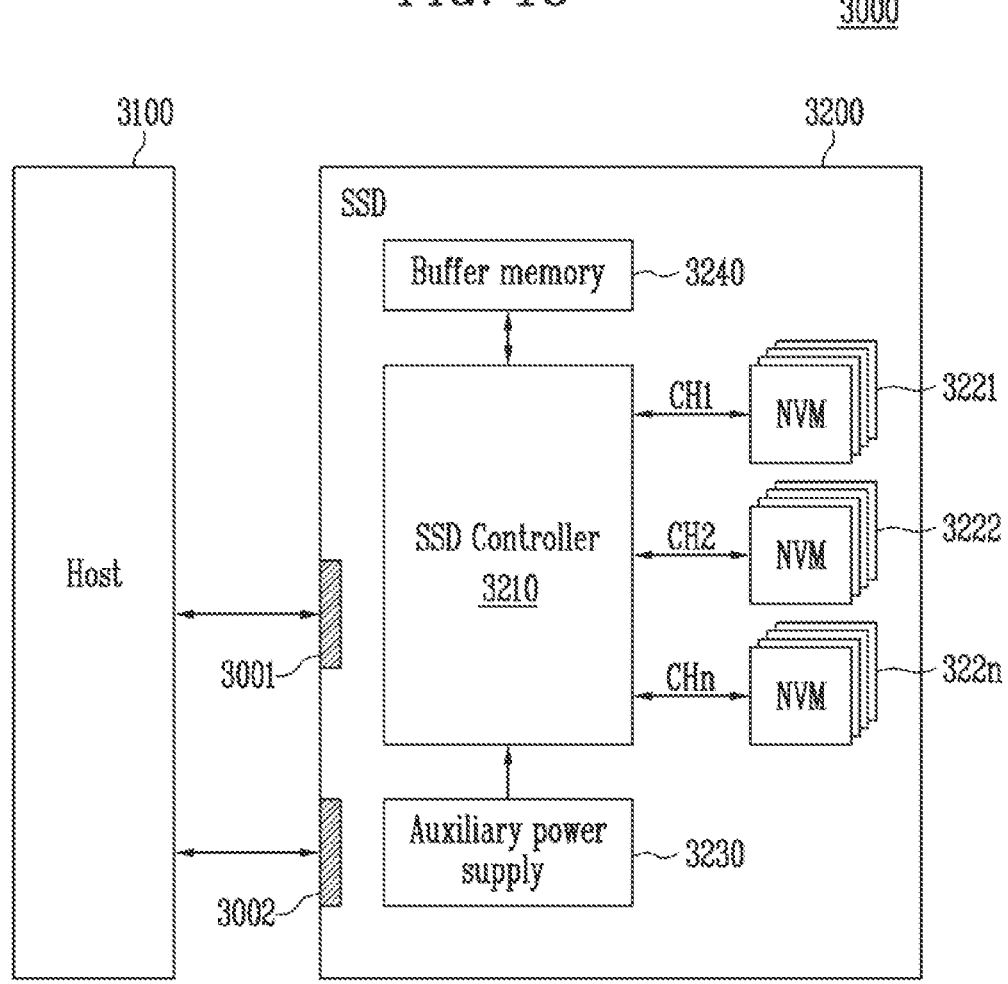
FIG. 18 is a block diagram illustrating an SSD system to which the memory system shown in FIG. 1 is applied.

FIG. 18 is a block diagram illustrating an SSD system to which the memory systems shown in FIG. 1 are applied.

Referring to FIG. 18, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may be a component corresponding to the memory controller 1200 shown in FIG. 1, and the flash memories 3221 to 322n may be components corresponding to the memory devices 1100 shown in FIG. 1.

The SSD controller 3210 may control the plurality of flash memories 3221 to 322n in response to a signal SIG received from the host 3100. Exemplarily, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATH), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. Exemplarily, the auxiliary power supply 3230 may be located in the SSD 3200, or be located at the outside of the SSD 3200.

For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, there can be provided a memory system capable of rapidly performing a program operation or a read operation on a super block configured by using at least two memory devices, and a method of operating a memory device included in the memory system.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory system comprising:
   a plurality of memory devices including a memory cell array having a plurality of planes, the plurality of memory devices being commonly connected to a memory controller through a channel;
   a super block including pages included in the planes of at least two memory devices among the plurality of memory devices; and
   the memory controller configured to transmit, to the memory devices, at least one command instructing an operation on the super block and an address corresponding to the command,
   wherein each of the memory devices includes:
   a peripheral circuit configured to perform the operation on the memory cell array;
   a group selection signal generator configured to output a group selection signal indicating the at least two memory devices constituting the super block; and
   control logic configured to control the peripheral circuit to perform an operation corresponding to the command, based on the group selection signal
   wherein each of the memory devices further includes a group address register configured to store a group address commonly allocated with respect to the at least two memory devices each including pages included in the super block, and
   wherein the control logic receives a group address allocation command and a first group address corresponding thereto from the memory controller, and stores the first group address in the group address register as a response to the group address allocation command.

2. The memory system of claim 1,
   wherein the command includes a read command, and
   wherein the control logic controls the peripheral circuit to perform a read operation corresponding to the read command by responding to the read command, based on the group selection signal.

3. The memory system of claim 2,
   wherein the control logic controls the peripheral circuit to perform a read operation corresponding to the read command on the planes included in the super block, based on the group selection signal.

4. The memory system of claim 1,
   wherein the control logic receives a group selection command and a second group address corresponding thereto from the memory controller, and compares the first group address and the second group address as a response to the group selection command.

5. The memory system of claim 4,
   wherein the control logic outputs, to the group selection signal generator, a first group activation signal indicating that the group selection command has been received.

6. The memory system of claim 5,
   wherein the control logic outputs, to the group selection signal generator, a second group activation signal indicating that the first group address and the second group address are the same.

7. The memory system of claim 6,
   wherein the control logic outputs, to the group selection signal generator, a group allocation enable signal indicating that a group address has been allocated, after the first group address is stored in the group address register.

8. The memory system of claim 7,
   wherein the group selection signal generator outputs the group selection signal to the control logic, based on the first group activation signal, the second group activation signal, and the group allocation enable signal.

9. The memory system of claim 1,
   wherein each of the memory devices includes memory buffer groups connected to each of the planes through a bit line,
   wherein the command includes a program command, and
   wherein the control logic performs a reset operation on the memory buffer groups connected to the planes constituting the super block by controlling the memory buffer groups, before the control logic receives the program command from the memory controller and receives the address from the memory controller.

10. A method of operating a memory device which includes a plurality of planes and is connected to a memory controller through a channel, the method comprising:
- receiving a group address allocation command and a first group address from the memory controller;
- storing the first group address in a group address register as a response to the group address allocation command;
- receiving a group selection command and a second group address from the memory controller;
- generating a group selection signal, based on a result obtained by comparing the first group address and the second group address, as a response to the group selection command;
- receiving at least one command instructing an operation on a super block and an address corresponding to the command from the memory controller; and
- performing an operation corresponding to the command, based on the group selection signal,
- wherein the super block includes pages included in planes of at least two memory devices among a plurality of memory devices commonly connected to the memory controller through the channel.

11. The method of claim 10,
wherein the command includes a read command, and
wherein the performing of the operation includes performing a read operation corresponding to the read command by responding to the read command, based on the group selection signal.

12. The method of claim 11,
wherein the performing of the read operation includes performing the read operation corresponding to the read command on the planes included in the super block, based on the group selection signal.

13. The method of claim 10,
wherein the first group address is an address commonly allocated with respect to the at least two memory devices each including pages included in the super block.

14. The method of claim 10,
wherein the receiving of the group selection command and the second group address from the memory controller includes generating a first group activation signal indicating that the group selection command has been received.

15. The method of claim 14,
wherein the generating of the group selection signal includes generating a second group activation signal indicating that the first group address and the second group address are the same.

16. The method of claim 15,
wherein the storing of the first group address in the group address register further includes generating a group allocation enable signal indicating that a group address has been allocated.

17. The method of claim 16,
wherein, in the generating of the group selection signal, the group selection signal is generated based on the first group activation signal, the second group activation signal, and the group allocation enable signal.

18. The method of claim 10,
wherein the command includes a program command, and
wherein, in the receiving of the at least one command and the address corresponding to the command, a reset operation is performed on memory buffer groups connected to the planes constituting the super block, before the program command is received and the address is received.

* * * * *